(12) United States Patent
Song et al.

(10) Patent No.: US 10,892,159 B2
(45) Date of Patent: Jan. 12, 2021

(54) SEMIPOLAR OR NONPOLAR GROUP III-NITRIDE SUBSTRATES

(71) Applicant: Saphlux, Inc., Branford, CT (US)

(72) Inventors: Jie Song, New Haven, CT (US); Jung Han, Woodbridge, CT (US)

(73) Assignee: Saphlux, Inc., Branford, CT (US)

( * ) Notice: Subject to any disclaimer, the term of this patent is extended or adjusted under 35 U.S.C. 154(b) by 82 days.

(21) Appl. No.: 15/818,344

(22) Filed: Nov. 20, 2017

(65) Prior Publication Data

US 2019/0157068 A1 May 23, 2019

(51) Int. Cl.
| | |
|---|---|
| *H01L 23/00* | (2006.01) |
| *H01L 21/20* | (2006.01) |
| *H01L 21/02* | (2006.01) |
| *H01L 29/20* | (2006.01) |

(Continued)

(52) U.S. Cl.
CPC ...... *H01L 21/0254* (2013.01); *H01L 21/0243* (2013.01); *H01L 21/0262* (2013.01); *H01L 21/02433* (2013.01); *H01L 21/02458* (2013.01); *H01L 21/02639* (2013.01); *H01L 21/02647* (2013.01); *H01L 29/045* (2013.01); *H01L 29/2003* (2013.01); *H01L 33/16* (2013.01); *H01L 21/02389* (2013.01); *H01L 21/02505* (2013.01)

(58) Field of Classification Search
None
See application file for complete search history.

(56) References Cited

U.S. PATENT DOCUMENTS

| | | | |
|---|---|---|---|
| 6,153,010 | A | 11/2000 | Kiyoku et al. |
| 6,274,518 | B1 | 8/2001 | Yuri et al. |
| 6,379,985 | B1 | 4/2002 | Cervantes et al. |

(Continued)

FOREIGN PATENT DOCUMENTS

| | | |
|---|---|---|
| WO | WO2001034877 | 5/2001 |
| WO | WO2015160903 | 10/2015 |

(Continued)

OTHER PUBLICATIONS

PCT, International Search Report and Written Opinion of the International Searching Authority for International Application No. PCT/US18/61800, dated Feb. 1, 2019, 25 pages.

(Continued)

*Primary Examiner* — Joseph C. Nicely
*Assistant Examiner* — Lamont B Koo
(74) *Attorney, Agent, or Firm* — MagStone Law, LLP

(57) ABSTRACT

Aspects of the disclosure provide for mechanisms for producing group III-nitride substrates. In accordance with some embodiments, a method for producing a group III-nitride substrate is provided. The method may include: forming, on a growth template, an epitaxial layer of a group III-nitride material comprising a surface with a first crystallographic orientation, wherein the first crystallographic orientation comprises a semipolar orientation or a nonpolar orientation; and separating the epitaxial layer of the group III-nitride material from the growth template to produce the group III-nitride substrate, wherein the growth template comprises a semiconductor layer of the group III-nitride material. The group III-nitride material may include gallium.

20 Claims, 12 Drawing Sheets

(51) Int. Cl.
*H01L 29/04* (2006.01)
*H01L 33/16* (2010.01)

(56) References Cited

U.S. PATENT DOCUMENTS

| | | |
|---|---|---|
| 6,900,070 B2 | 5/2005 | Craven et al. |
| 7,018,912 B2 | 3/2006 | Kim et al. |
| 7,067,401 B2 | 6/2006 | Kim et al. |
| 7,154,163 B2 | 12/2006 | Hon et al. |
| 7,361,576 B2 | 4/2008 | Imer et al. |
| 7,687,293 B2 | 3/2010 | Sato et al. |
| 7,777,241 B2 | 8/2010 | Moustakas et al. |
| 8,008,170 B2 | 8/2011 | Liang et al. |
| 8,048,786 B2 | 11/2011 | Chyi et al. |
| 8,367,445 B2 | 2/2013 | Okuno |
| 8,853,030 B2 | 10/2014 | Lee et al. |
| 9,196,795 B2 | 11/2015 | Su et al. |
| 9,337,390 B2 | 5/2016 | Sako et al. |
| 2003/0150843 A1* | 8/2003 | Doi ............... B23K 26/40 219/121.6 |
| 2006/0005763 A1* | 1/2006 | Schowalter ........... C30B 23/00 117/95 |
| 2007/0138505 A1* | 6/2007 | Preble ................ C30B 25/02 257/190 |
| 2009/0252191 A1 | 10/2009 | Kubota et al. |
| 2010/0025727 A1 | 2/2010 | Haskell |
| 2010/0096615 A1 | 4/2010 | Okamoto et al. |
| 2010/0327291 A1 | 12/2010 | Preble et al. |
| 2011/0140072 A1 | 6/2011 | Varangis et al. |
| 2013/0099202 A1 | 4/2013 | Hardy et al. |
| 2013/0143394 A1 | 6/2013 | Faurie et al. |
| 2013/0256697 A1 | 10/2013 | Dadgar et al. |
| 2014/0065360 A1* | 3/2014 | D'Evelyn ........... C30B 29/406 428/141 |
| 2014/0077223 A1 | 3/2014 | Choe et al. |
| 2014/0264379 A1 | 9/2014 | Kub et al. |
| 2015/0311068 A1 | 10/2015 | Tsukada et al. |
| 2016/0027636 A1 | 1/2016 | Han et al. |
| 2016/0163541 A1 | 6/2016 | Hashimoto |
| 2017/0033186 A1 | 2/2017 | Han et al. |
| 2018/0112330 A1* | 4/2018 | Kim ..................... C30B 29/06 |

FOREIGN PATENT DOCUMENTS

| | | |
|---|---|---|
| WO | WO2015160909 | 10/2015 |
| WO | WO2018031876 | 2/2018 |

OTHER PUBLICATIONS

Scholz et al., "Semipolar GaN-based Heterostructures on Foreign Substrates" Physica Status Solidi B vol. 253(1), 2016, 25 pages.
PCT, International Search Report and Written Opinion of the International Searching Authority for International Application No. PCT/US18/62039, dated Feb. 1, 2019, 12 pages.

* cited by examiner

SEMIPOLAR OR NONPOLAR GROUP III-NITRIDE SUBSTRATES

TECHNICAL FIELD

The implementations of the disclosure relate generally to fabrication of semiconductor and, more specifically, to producing group III-nitride substrates, such as gallium nitride substrates. The group III-nitride substrates may be bulk substrates that are free of stacking faults and may contain group III-nitride materials of any semipolar or nonpolar orientation.

BACKGROUND

Group III-V materials (e.g., AlN, GaN, and InN) are suitable materials for fabrication of a variety of semiconductor devices. For example, gallium nitride (GaN) and other III-nitride materials have relatively wide band gaps and can be used to make electro-optic devices (e.g., light-emitting diodes (LEDs), laser diodes (LDs), etc.) that emit radiation in the green and blue regions of the visible spectrum. Group III nitride materials can also be used to fabricate high-power electronics because they exhibit higher breakdown voltages when used for fabricating integrated transistors.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In accordance with some embodiments of the present disclosure, a method for producing a group III-nitride substrate is provided. The method may include: forming, on a growth template, an epitaxial layer of a group III-nitride material comprising a surface with a first crystallographic orientation, wherein the first crystallographic orientation comprises a semipolar orientation or a nonpolar orientation; and separating the epitaxial layer of the group III-nitride material from the growth template to produce the group III-nitride substrate, wherein the growth template comprises a semiconductor layer of the group III-nitride material.

In some embodiments, the epitaxial layer of the group III-nitride material is free of stacking faults.

In some embodiments, forming the epitaxial layer of the group III-nitride material may include growing the group III-nitride to a thickness greater than 100 microns.

In some embodiments, the group III-nitride material comprises gallium.

In some embodiments, the semiconductor layer is free of stacking faults.

In some embodiments, forming, on the growth template, the epitaxial layer of the group III-nitride material on the first epitaxial layer may include growing the group III-nitride material utilizing at least one of a hydride vapor phase epitaxy (HVPE) process, a molecular beam epitaxy (MBE) process, or a metalorganic chemical vapor deposition (MOCVD) process.

In some embodiments, the epitaxial layer of the group III-nitride material is separated from the growth template along a longitudinal direction of the growth template.

In some embodiments, growing the epitaxial layer of the group III-nitride material may include growing the group III-nitride material on a process surface of the growth template. In some embodiments, separating the epitaxial layer of the group III-nitride material from the growth template comprises separating the surface of the epitaxial layer from the process surface of the growth template.

In some embodiments, the process surface of the growth template may include a facet with the first crystallographic orientation.

In some embodiments, the method may further include growing the semiconductor layer of the group III-nitride material on a foreign substrate, wherein a substrate surface of the foreign substrate is approximately parallel to a crystallographic plane of the foreign substrate with a second crystallographic orientation, and wherein the substrate surface of the foreign substrate is approximately parallel to the process surface of the growth template.

In some embodiments, the foreign substrate may include sapphire. In some embodiments, the first crystallographic orientation may include (20$\bar{2}$1), and the second crystallographic orientation may include (22$\bar{4}$3).

In some embodiments, growing the semiconductor layer may further include removing stacking faults from at least one region of the semiconductor layer.

In some embodiments, growing the semiconductor layer may further include growing a first facet of the semiconductor layer at a first growth rate, wherein the first facet has a crystallographic orientation associated with stacking faults; and growing a second facet of the semiconductor layer at a second growth rate, wherein the second growth rate is greater than the first growth rate.

In some embodiments, the method may further include doping the semiconductor layer with a dopant to control the first growth rate and/or the shape of semiconductor crystals grown in the semiconductor layer. In some embodiments, the dopant may include antimony (Sb), germanium (Ge), bismuth (Bi), etc.

In accordance with some embodiments of the present disclosure, a substrate is provided. The substrate may include an epitaxial layer of a group III-nitride material. The epitaxial layer of the group III-nitride material may include a first surface approximately parallel to a nonpolar plane or a semipolar plane of the group III-nitride material. The substrate may further include a second surface approximately parallel to the first surface. The substrate may be free of stacking faults. In some embodiments, a thickness of the epitaxial layer of the group III-nitride material is greater than 100 microns. In some embodiments, a diameter of the group III-nitride substrate is greater than 2 inches.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
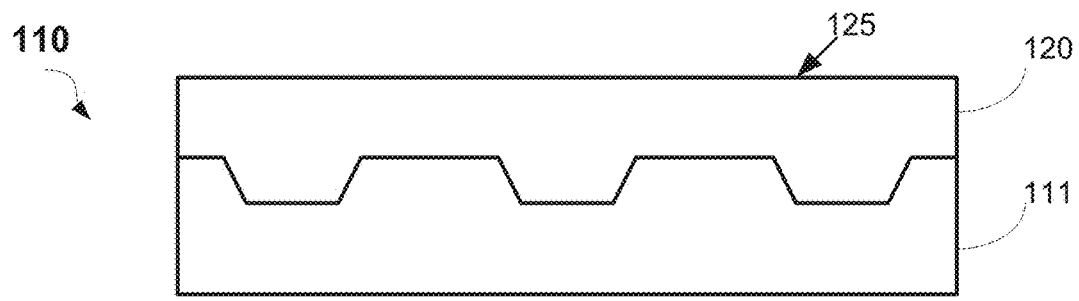
FIGS. 1A, 1B, and 1C depict structures associated with a process for producing group III-nitride substrate in accordance with some embodiments of the present disclosure.

Aspects of the disclosure provide for mechanisms for fabricating group-III nitride substrates with nonpolar or semipolar orientations. Examples of the semipolar orientations may include orientations with Miller indices of (20$\bar{2}$1), (20$\bar{2}\bar{1}$), (30$\bar{3}$1), (30$\bar{3}\bar{1}$), (10$\bar{1}$1), (11$\bar{2}$2), etc. Examples of the nonpolar orientations may include orientations with Miller indices of (11$\bar{2}$0), (10$\bar{1}$0), etc.

Semipolar and nonpolar gallium nitride (GaN) have been demonstrated to be significantly beneficial for high efficiency light emitting diodes (LEDs) and laser diodes (LDs) due to the reduced internal polarization field and surface atomic configuration. For example, high output power green and blue LEDs and laser diodes (LDs) have been demonstrated on GaN with (20$\bar{2}$1), (20$\bar{2}\bar{1}$), and other semipolar orientations. These high-brightness semipolar GaN devices may be produced on bulk GaN substrates.

Because it may be difficult to obtain high-quality substrates of GaN and other group III-nitride materials, a group III-nitride material may typically be heteroepitaxially grown on a foreign substrate of a different material. For example, GaN may be grown on a sapphire substrate. However, large lattice mismatches may exist between the foreign substrate and epitaxial layers of the group III-nitride material and may lead to formation of threading dislocations. This may deteriorate the quality of the semiconductor devices formed using the group III-nitride material.

Prior solutions for providing group III-nitride substrates typically involve growing bulk GaN crystal on a c-plane and cross-slicing the bulk GaN crystal to produce strips of the GaN crystal. The strips may be used as GaN wafers. The slicing direction is perpendicular to the c-plane. As a result, the sizes of the GaN bulk substrates produced using the prior solutions are limited to the thickness of the bulk GaN crystal. For example, a GaN bulk substrate produced using the prior solutions typically has a width of a few millimeters. As such, the GaN wafers produced using the prior solutions are difficult to scale-up and are not compatible with commercial LED applications that require wafers of large sizes (e.g., a diameter larger than 2 inches). Moreover, stacking faults may be present in the GaN wafers. The stacking faults may provide alternative recombination pathways for carriers and may adversely affect the performance of semiconductor devices manufactured on the GaN wafers.

Aspects of the disclosure address the above deficiencies and other deficiencies of the prior solutions by providing mechanisms for fabricating group-III nitride substrates with nonpolar or semipolar orientations. A group-III nitride substrate (e.g., a GaN substrate) produced in accordance with the present disclosure may be free of stacking faults and may have a large area suitable for fabrication of semiconductor devices. The group III-nitride substrate may have any suitable orientation, such as a semipolar orientation or a nonpolar orientation.

In some embodiments, the mechanisms according to the present disclosure may provide a growth template for fabrication of the group III-nitride substrate. The growth template may include a semiconductor layer of a group III-nitride material. The semiconductor layer may be formed on a foreign substrate (e.g., a sapphire substrate) using any suitable epitaxial growth technique. In some embodiments, the semiconductor layer may be formed by growing the group III-nitride material in a particular semipolar or nonpolar orientation utilizing an orientation-controlled epitaxy process.

In one implementation, growing the semiconductor layer may involve doping the semipolar conductor layer with a suitable dopant to accelerate a growth rate of facets that may result in stacking faults and/or to control the shape of semiconductor crystals grown in the semiconductor layer.

The dopant may include, for example, antimony (Sb), germanium (Ge), bismuth (Bi), etc. The doped semiconductor layer may be free of or substantially free of stacking faults.

In another implementation, stacking faults may be present in one or more regions of the semiconductor layer (also referred to as the "stacking-fault regions") during the growth of the semiconductor layer. The stacking faults may be removed (e.g., eliminated and/or minimized) from the semiconductor layer. For example, one or more of the stacking-fault regions may be removed from the semiconductor layer by selectively etching the semiconductor layer. One or more voids may be formed in the semiconductor layer due to the removal of the stacking-fault regions. The group III-nitride material may be regrown after the removal of the stacking-fault regions to fill the voids. The regrowth of the group III-nitride material may include, for example, growing facets of various orientations at various growth rates. For example, one or more facets of an orientation associated with the stacking-fault regions (e.g., a (000$\bar{1}$) orientation) may be grown at a first growth rate while one or more facets associated with other orientations (e.g., (10$\bar{1}\bar{1}$), (10$\bar{1}$1), etc.) may be grown at a second growth rate. The first growth rate may be faster than the second growth rate.

The mechanisms can grow a layer of semipolar or nonpolar group III-nitride materials on the growth template. For example, an epitaxial layer of the group III-nitride material can be formed on the growth template utilizing any suitable epitaxial growth techniques, such as a hydride vapor phase epitaxy (HVPE) process, a molecular beam epitaxy (MBE) process, a metalorganic chemical vapor deposition (MOCVD) process, etc. In some embodiments, the mechanisms can separate the layer of the semipolar or nonpolar group III-nitride material from the growth template to produce the group III-nitride substrate.

Accordingly, aspects of the present disclosure provide for cost-effective and scalable mechanisms for producing bulk semipolar or nonpolar group III-nitride substrates (e.g., GaN substrates) that are free of stacking faults. The semipolar or nonpolar group III-nitride substrates may have any desirable semipolar orientation or nonpolar orientation. A diameter of a group III-nitride substrate according to some embodiments of the present disclosure may be greater than 2 inches (e.g., 4 inches, 6 inches, etc.).

As referred to herein, a group III material may be any material that includes an element in the boron group, such as gallium (Ga), indium (In), thallium (Tl), aluminum (Al), and boron (B). A group III-nitride material may be any nitride material containing one or more group III materials, such as gallium nitride, aluminum nitride (AlN), aluminum gallium nitride (AlGaN), indium nitride (InN), indium gallium nitride (InGaN), etc.

As referred to herein, a semipolar plane may be a crystallographic plane oriented in a semipolar direction. The semipolar direction may be, for example, orientations with Miller indices of (20$\bar{2}$1), (20$\bar{2}\bar{1}$), (30$\bar{3}$1), (30$\bar{3}\bar{1}$), (10$\bar{1}$1), (11$\bar{2}$2), etc. A nonpolar plane may be a crystallographic plane oriented in a nonpolar direction. The nonpolar direction may be, for example, orientations with Miller indices of (11$\bar{2}$0), (10$\bar{1}$0), etc.

Examples of embodiments of the present disclosure will be described in more detail with reference to the accompanying drawings. It should be understood that the following embodiments are given by way of illustration only to provide thorough understanding of the disclosure to those skilled in the art. Therefore, the present disclosure is not limited to the following embodiments and may be embodied in different ways. Further, it should be noted that the drawings are not to precise scale and some of the dimensions, such as width, length, thickness, and the like, can be exaggerated for clarity of description in the drawings. Like components are denoted by like reference numerals throughout the specification.

Figure 1B:
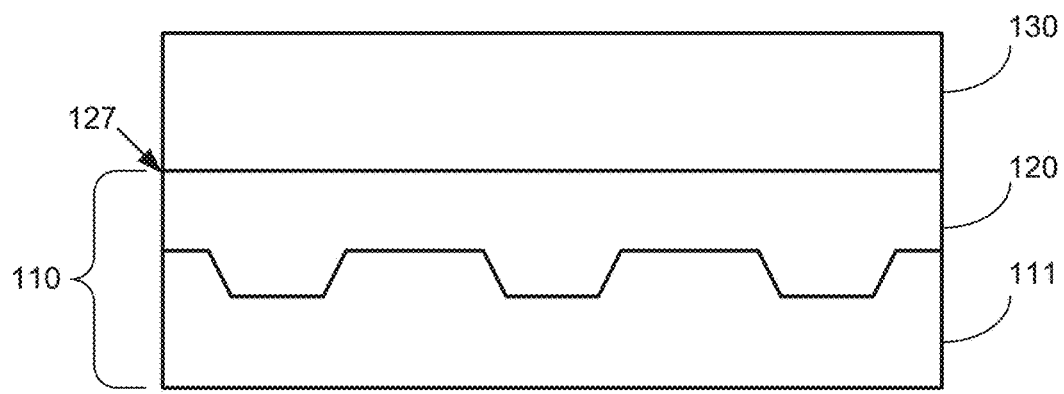
Figure 1C:
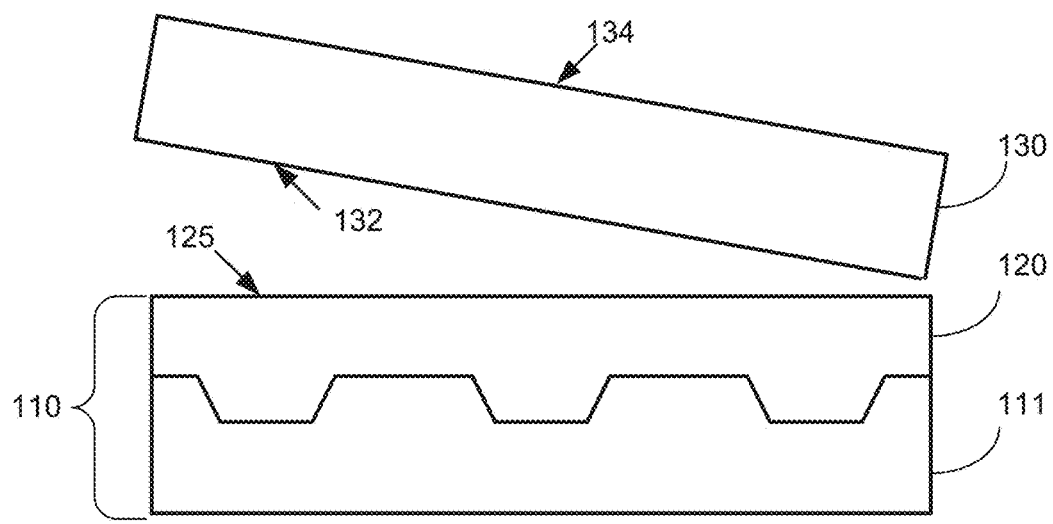

FIGS. 1A-1C illustrate structures associated with a process for producing group III-nitride substrates in accordance with some embodiments of the present disclosure.

Turning to FIG. 1A, a growth template 110 may be provided. Growth template 110 may include one or more layers and may include any suitable material for growing a group III-nitride material (e.g., gallium nitride). For example, growth template 110 may include a substrate 111 and a semiconductor layer 120. The semiconductor layer 120 and the substrate 111 may or may not include different materials. In some embodiments, the substrate 111 may be a foreign substrate containing a material that is not contained in the semiconductor layer 120. For example, the semiconductor layer 120 may include an epitaxial layer of a group III-nitride material (e.g., gallium nitride). The foreign substrate 111 may contain any other suitable crystalline material that can be used to grow the group III-nitride material, such as sapphire, silicon carbide (SiC), silicon (Si), quartz, gallium arsenide (GaAs), aluminum nitride (AlN), etc. The substrate 111 may have any suitable size and/or shape for growth of group III-nitride materials. In some embodiments, the substrate 111 may be a large-area substrate (e.g., a substrate of a diameter that is equal to or larger than 2 inches).

The semiconductor layer 120 may contain one or more group III-nitride materials having any suitable crystallographic orientation, such as a nonpolar orientation or a semipolar orientation. Examples of the nonpolar orientation may include (20$\bar{2}$1), (10$\bar{1}$1), (11$\bar{2}$2), etc. Examples of the semipolar orientation may include (11$\bar{2}$0), (10$\bar{1}$0), etc. The semiconductor layer 120 may be free of and/or substantially free of stacking-faults. As referred to herein, a layer of a group III-nitride material may be regarded as being substantially free of stacking faults when the density of stacking faults in the layer of the group III-nitride material is not greater than a threshold.

While one layer of the semiconductor layer 120 is depicted in FIG. 1A, this is merely illustrative. The semiconductor layer 120 may include any suitable number of layers of group III-nitride materials and/or any other suitable crystalline material. In some embodiments, one or more other layers of crystalline materials (not shown) may be deposited between the substrate 111 and the semiconductor layer 120.

In some embodiments, the semiconductor layer 120 may include one or more surfaces exposing a crystallographic plane with a desired crystallographic orientation (e.g., a semipolar orientation or a nonpolar orientation). For example, a surface 125 of the semiconductor layer 120 may expose a semipolar plane or a nonpolar plane. The surface 125 may be parallel to or approximately parallel to a crystallographic plane with a desired semipolar orientation or a nonpolar orientation. The surface 125 is also referred to herein as the "process surface" of the semiconductor layer 120 and/or the growth template 110.

The substrate 111 may be and/or include a planar substrate, a patterned substrate, etc. In some embodiments, the substrate 111 may be and/or include a patterned substrate having an array of surface structures (e.g., ribs separated by trenches) patterned across a surface of the foreign substrate 111. The surface structures may include a plurality of planar and/or approximately planar surfaces (also referred to herein as the "planar surfaces"). One or more of the planar surfaces may be covered by a masking material that may prevent crystal growth of one or more group III-nitride materials. One or more of the planar surfaces are not covered by the masking material and may initiate epitaxial growth of a group III-nitride material (also referred to as the "crystal-growth surfaces"). In some embodiments, each of the crystal-growth surfaces may be parallel to or approximately parallel (e.g., within 10 mrad) to a particular crystallographic plane (e.g., a c-plane) of the foreign substrate 111. The patterned substrate may be produced, for example, by performing one or more operations described in connection with FIGS. 2A-2G below.

In some embodiments, the semiconductor layer 120 may be formed by growing one or more group III-nitride materials on the substrate 111 utilizing an orientation-controlled epitaxy process. For example, group III-nitride crystals may be grown with a selected crystallographic plane in a direction that is parallel to the crystal-growth surfaces of the substrate 111. The selected crystallographic plane may be, for example, a semipolar plane or a nonpolar plane (e.g., a (20$\bar{2}$1) plane for gallium-polar semipolar, a (20$\bar{2}$1) plane for nitrogen-polar semipolar). In some embodiments, the group III-nitride crystals may be grown from the crystal growth surfaces at distinct locations. The growth of the group III-nitride crystals may continue until the group III-nitride material coalesces above the patterned features on the substrate 111 and forms a continuous epitaxial layer. In some embodiments, one or more buffer layers may be formed on the substrate 111 prior to the growth of the epitaxial layer of the group III-nitride material. In some embodiments, the semiconductor layer 120 may be formed by performing one or more operations described in connection with FIGS. 2A-3 below.

In some embodiments, stacking faults may occur as the semiconductor layer 120 grows. For example, stacking faults may occur in a crystallographic orientation (e.g., the (000$\bar{1}$) orientation). In some embodiments, the stacking faults may occur along an interface where the semiconductor layer 120 (e.g., a nitrogen-polar basal plane (000$\bar{1}$) front) contacts the foreign substrate 111 (also referred to as the "heterogeneous interface"). In some embodiments, various quantities and/or densities of stacking faults may occur on various facets of the semiconductor layer 120 (e.g., facets of different orientations). For example, group III-nitride material crystals that form in a basal plane (e.g., a (000$\bar{1}$) plane) may have more stacking faults than group III-nitride material crystals that form in another plane (e.g., a (10$\bar{1}$1) plane).

In one implementation, the stacking faults may be minimized and/or eliminated, for example, by terminating the growth of the semiconductor layer 120 (also referred to as the "initial growth") after regions of stacking faults have formed and removing (e.g., selectively etching away) the regions of stacking faults. The removal of the regions of stacking faults may form one or more voids in the semiconductor layer 120. Regrowth of the group III-nitride material may be carried out to fill the voids. The regrowth of the group III-nitride may involve controlling facets of various orientations to be grown at various grown rates. In some embodiments, one or more facets associated with the stacking faults may be grown at a first rate while one or more facets associated no stacking faults or few stacking faults (e.g., a density of stacking faults less than a threshold) may be growth at a second growth rate. The first rate may be faster than the second growth rate. For example, the growth rate of the group III-nitride in one or more facets associated with the stacking faults (e.g., facets with one or more undesired orientations) may be accelerated. In some embodiments, the growth rate of the group III-nitride material in the facets with the undesired orientation(s) may be accelerated by introducing one or more suitable impurity dopants during the growth of the group-III nitride material. The dopants may include, for example, antimony (Sb), germanium (Ge), bismuth (Bi), etc. As another example, the growth of the group III-nitride material in one or more orientations that are not associated with the stacking faults may be slowed.

According to the Wulff principal, the facets with the highest growth rate may terminate more quickly than the facets with lower growth rates, and the crystal shape may be dominated by the facets with the lower growth rates. Elimination of a growth facet of an undesired orientation can remove it as a source of stacking-fault formation.

In another implementation, the initial growth of the semiconductor layer 120 on the substrate 111 may involve growing facets of various orientations at various growth rates. For example, the growth rate of the group III-nitride in one or more facets associated with the stacking faults (e.g., facets with one or more undesired orientations) may be greater than that of the group III-nitride material in one or more facets that are not associated with the stacking faults. The growth rate of the group III-nitride in the facets associated with the stacking faults may be accelerated by, for example, adding a suitable impurity dopant during the growth of the semiconductor layer 120. The impurity dopant may include Sb, Ge, or Bi in some embodiments. As such, the initial growth of the group III-nitride material does not introduce stacking faults in the semiconductor layer 120. In some embodiments, the stacking faults may be minimized and/or eliminated by performing one or more operations described in connection with FIGS. 6A-9 below.

Turning to FIG. 1B, an epitaxial layer 130 of the group III-nitride material may be formed on the growth template 110. The epitaxial layer 130 may be formed by growing the III-nitride material using any suitable epitaxial growth process, such as hydride vapor phase epitaxy (HVPE), molecular beam epitaxy (MBE), metalorganic chemical vapor deposition (MOCVD), etc. For example, the epitaxial layer 130 may be formed by growing an epitaxial layer of the group III-nitride material (e.g., GaN) in a HVPE reactor with suitable growth conditions (e.g., a suitable growth temperature, a suitable growth pressure, a suitable growth rate, etc.). The growth temperature of the epitaxial layer 130 may be, for example, a temperature of around 900 to 1100° C. The pressure for the growth of the epitaxial layer 130 may be, for example, between 50 to 500 mbar. The growth rate of epitaxial layer 130 may be, for example, between 1 to 200 μm/h.

The epitaxial layer 130 may be grown at a suitable growth rate for a certain time period to deposit an epitaxial layer of a desired thickness. The epitaxial layer 130 may have any suitable thickness, such as a thickness between 100 microns and 1 centimeter. In some embodiments, the thickness of the layer 130 may be greater than 100 microns. In some embodiments, the thickness of the layer 130 may be greater than 3000 microns. In some embodiments, the thickness of layer 130 can be greater than the thickness of layer 120. The size of the epitaxial layer 130 (e.g., a diameter of the epitaxial layer 130) may be the same as or substantially the same as the size of the foreign substrate 111 and/or the growth template 110 (e.g., a diameter of the foreign substrate 111 and/or the growth template 110). In some embodiments, a diameter of layer 130 may be 2 inches, 4 inches, 6 inches, and/or any other suitable value. In some embodiments, the diameter of the epitaxial layer 130 may be equal to or greater than 2 inches.

As illustrated in FIG. 1C, the epitaxial layer 130 may be separated from the growth template 110. In some embodiments, the epitaxial layer 130 may be separated from the growth template 110 along a longitudinal direction of the growth substrate 110. The longitudinal direction of the growth template 110 may be parallel to and/or approximately parallel to the process surface of the growth template 110.

In some embodiments, the epitaxial layer 130 may be separated from the growth template 110 along an interface 127 between the growth template 110 and the epitaxial layer 120. The interface may be defined by the surface 125 of the growth template 110 and a surface 132 of the epitaxial layer 130. The surface 125 and the surface 132 may or may not contact each other. In some embodiments, one or more portions of the surface 125 contact one or more portions of the surface 132. The interface may be parallel to or approximately parallel to the longitudinal direction of the growth substrate 110.

The separation of the semiconductor layer 120 from the growth template 110 may be achieved using any suitable technique or combination of techniques. For example, the epitaxial layer 130 may be separated from the growth template 100 using a wire saw (e.g., by slicing the interface or a portion of the epitaxial layer 130 along the longitudinal direction of the growth template 110). As another example, the layer 120 may be separated from the growth template 110 by laser lift-off and/or chemical lift-off.

In some embodiments, a semiconductor layer (not shown) including air voids may be formed between the growth template and the epitaxial layer 130 (also referred to as the "sacrificial layer"). In some embodiments, the sacrificial layer may be regarded as being part of the growth template 110. The epitaxial layer 130 may be separated from the growth template 110 via the sacrificial layer. For example, the epitaxial layer 130 can be separated from the growth template 110 by application of physical force to the sacrificial layer. As another example, the epitaxial layer 130 can be separated from the sacrificial layer by chemical etching. In some embodiments, after separation of the epitaxial layer 130 from the growth template 110, the sacrificial layer can remain on the growth template 110.

Upon separation from the growth template 110, the epitaxial layer 130 may then be used as a free-standing group III-nitride substrate. The free-standing group III-nitride may have a wurtzite structure and may have a nonpolar or semipolar orientation. Each of the surfaces 132 and 134 of the epitaxial layer 130 and/or the group III-nitride substrate may be a continuous planar surface. The surfaces 132 and/or 134 may be parallel to or approximately parallel to a desired crystallographic plane of the group III-nitride material, such as a semipolar plane or a nonpolar plane. In some embodiments, the surfaces 132 and/or 134 may expose a single semipolar plane or a single nonpolar plane of the group III-nitride material.

The epitaxial layer 130 may be free of or substantially free of stacking faults. As referred to herein, an epitaxial layer of a group III-nitride material may be regarded as being substantially free of stacking faults when the density of stacking faults in the epitaxial layer of the group III-nitride material is not greater than a threshold. A device manufacturing process can be performed on the free-standing group III-nitride substrate to form LEDs and/or any other desired semiconductor device.

Figure 2A:
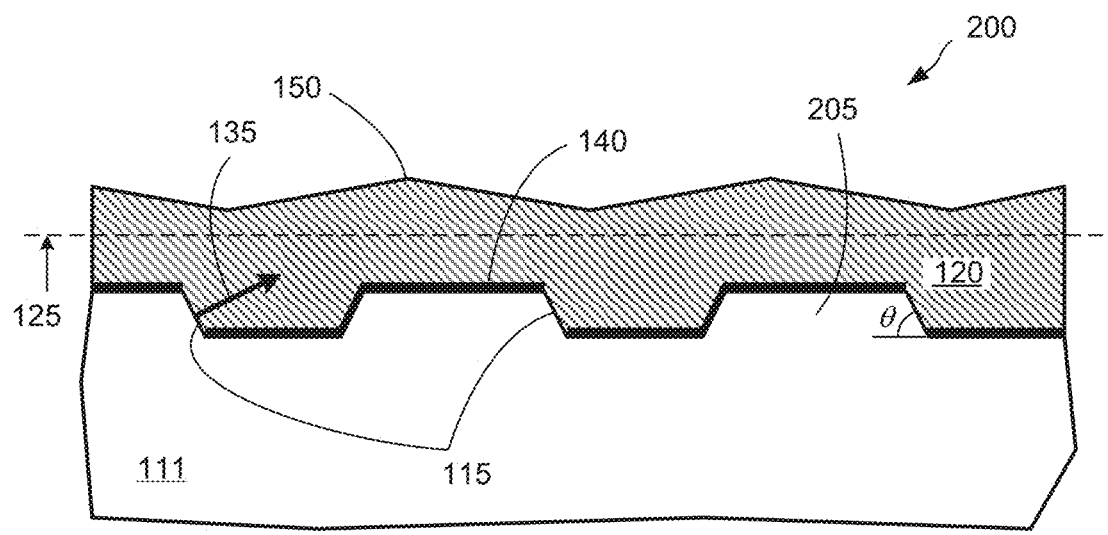
FIG. 2A depicts a diagram illustrating an example of a growth template in accordance with some implementations of the disclosure.

FIG. 2A depicts a diagram illustrating an example 200 of a growth template in accordance with some implementations of the disclosure. The growth template 200 of FIG. 2 may be the same as the growth template 110 of FIG. 1 in some embodiments.

As illustrated in FIG. 2A, the growth template 200 may include an epitaxial layer 120 of III-nitride material formed over a foreign substrate 111. The semiconductor layer 120 of FIGS. 1A-1C may be and/or include the epitaxial layer 120 in some embodiments. The substrate 111 of FIGS. 1A-1C may be and/or include the foreign substrate 111 in some embodiments. The foreign substrate 111 may include any crystalline material that is suitable for growth of the III-nitride material thereon. For example, the foreign substrate 111 may include sapphire, silicon, silicon carbide, gallium-arsenide, etc.

In some embodiments, the foreign substrate 111 can be a patterned substrate having an array of surface structures 205 (e.g., ribs separated by trenches) patterned across a surface of the substrate 111. The surface structures 205 and substrate 111 may comprise a plurality of planar and/or approximately planar surfaces (also referred to herein as the "planar surfaces"). One or more of the planar surfaces may be covered by a masking material 140 that may prevent crystal growth from regions of the substrate. One or more of the planar surfaces may be slightly curved, in some embodiments and need not be straight as depicted. The planar surfaces may be oriented in one or more directions. Multiple planar surfaces may be oriented in different directions in some embodiments. For example, surface normal vectors may point in different directions, which may be crystallographic orientations in some implementations of the present disclosure.

According to some embodiments, one or more of the planar surfaces of the foreign substrate 111 (e.g., surfaces 115) are not covered by the masking material 140 and may serve as crystal-growth surfaces. The crystal-growth surfaces 115 may initiate epitaxial growth of a group III-nitride material, whereas the masking material 140 may inhibit growth of the III-nitride material. The crystal-growth surfaces 115 may be parallel and/or approximately parallel (e.g., within 10 mrad) to a c-plane facet (e.g., a (0001) facet) of the substrate 111 according to some embodiments, having a normal direction [0001] depicted by the arrow 135 in FIG. 2A. The crystal-growth surfaces 115 may be perpendicular to (90°) or inclined at an angle θ between 0° and 90° with respect to a surface of the foreign substrate 111 (e.g., a substrate surface 108 as depicted in FIG. 2B).

Group III-nitride semiconductor may be grown from the crystal-growth surfaces 115. The growth of the group III-nitride semiconductor may initiate at distinct locations and may continue until the group III-nitride semiconductor coalesces above the patterned features on the foreign substrate 111 and form a continuous epitaxial layer. The group III-nitride semiconductor may extend partially or entirely across the foreign substrate 111 and may form a planar surface 125 as illustrated in FIGS. 1A-2A.

An etching process may be selected (e.g., tailoring etching conditions) to achieve a desired inclination angle θ of the crystal-growth surfaces 115 with respect to the substrate surface of the sapphire substrate 111. In some embodiments, the inclination angle θ is made to be approximately the same as the angle of the sapphire's c-plane facet, which determines an orientation of the subsequently-grown III-nitride material. In this manner, any crystallographic plane of the III-nitride material may be made approximately parallel to or inclined at a desired angle with respect to a finished process surface of the substrate on which integrated circuit devices may be formed. The surface 125 in FIG. 2A is depicted as being parallel to a process surface 108 of the sapphire substrate 111 into which patterns are formed.

Figure 2B:
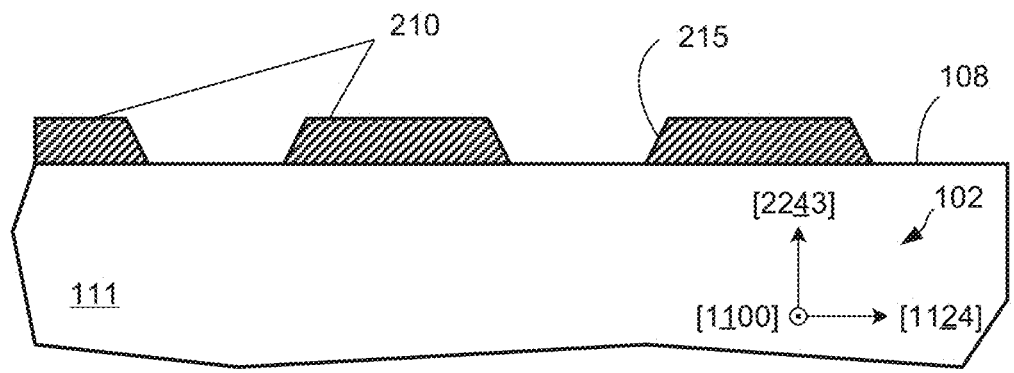
FIGS. 2B and 2C depict structures associated with a process for providing a patterned foreign substrate in accordance with some embodiments of the present disclosure.
Figure 2C:
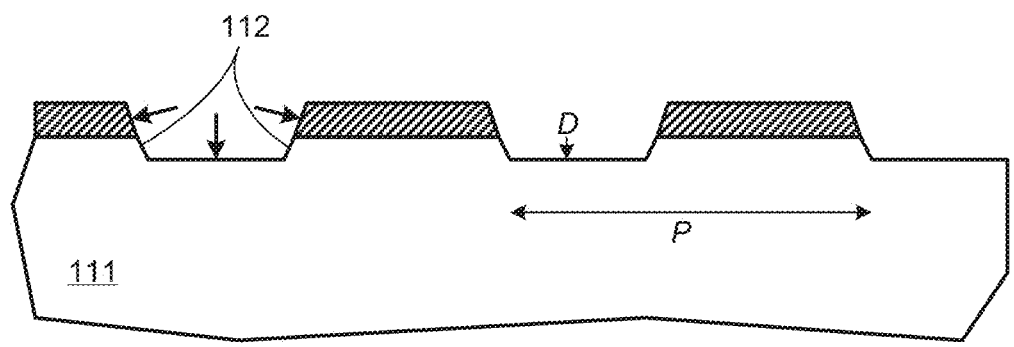

FIGS. 2B-2C depict structures associated with a method for forming a patterned foreign substrate, according to some embodiments of the present disclosure. The patterned foreign substrate may be, for example, a patterned sapphire substrate. An initially unetched substrate 111 (e.g., an unetched sapphire substrate) may be cut with a particular crystallographic orientation based on a desired crystallographic orientation of a group III-nitride layer to be formed on the substrate 111. The desired crystallographic orientation of the group III-nitride layer may be any semipolar orientation or nonpolar orientation. For example, to facilitate growth of a group III-nitride layer with a (20$\bar{2}$1) semipolar orientation, an initially unetched sapphire substrate 111 may be cut so that its (22$\bar{4}$3) plane is approximately parallel to a top surface 108 of the sapphire substrate 111. A resist 210 may be deposited and patterned on the surface of the sapphire substrate 111. The resist may be patterned as a periodic grating, according to some embodiments, so that bars of resist 210 may extend along the surface of the substrate (into the page as depicted in FIG. 2B). The resist pattern may be aligned to a crystallographic orientation of the sapphire substrate, so that the bars of resist 210 run in a direction that is approximately normal (e.g., within 10 mrad) to the (1$\bar{1}$00) plane of the sapphire substrate 111. In one implementation, the resist 210 may be a soft resist (e.g., a polymeric resist). In another implementation, the resist 210 may be a hard resist (e.g., patterned inorganic material). In some cases, the resist may be patterned to have sloping side walls 215, as depicted in the FIG. 2B. The resist 210 may be patterned via photolithography, interferometric lithography, and/or any other suitable patterning process.

As illustrated in FIG. 2B, a dry etching process (e.g., a reactive ion etching (RIE) process) may be used to etch the sapphire substrate 111. The etching process may be anisotropic or semi-anisotropic. According to some embodiments, the etching process may be semi-selective, in that it etches some of the resist 210, while primarily etching the substrate 111. In a semi-selective etch, as the etching of the sapphire substrate 111 proceeds, the resist 210 may etch back in addition to trenches being etched into the substrate. In some embodiments, a chlorine-based etchant may be used for etching the sapphire. Examples of etch gases for sapphire may include $BCl_3$, $Cl_3$, and Ar or combination thereof. An etch pressure may be between 10 mTorr and 100 mTorr. In some implementations, a small amount of an etchant for the resist (e.g., $O_2$ for a polymeric resist) may be included as an etchant gas to etch back some of the resist 210.

Other etchants or etching processes may be used in other embodiments depending on the material used for the resist and/or on the substrate material. In some implementations, an etchant for the sapphire substrate may partially etch a resist 210. For example, when silicon (Si) is used as the substrate, a strong base solution (such as KOH, NOH, etc.) may be used to anisotropically wet-etch the Si and expose (111) facets from which GaN may be grown. The (111) facets may be exposed in grooves that are produced by the wet etching. The (111) facets may be oriented at any angle between 0° and 90° with respect to a planar surface of the Si substrate.

The result of partially etching back the resist while the trenches are being etched may create sloped sidewalls 212 inclined at an angle θ along the trenches in the sapphire substrate 111, as depicted in FIG. 2B. Instead of the sidewalls being orientated 90° with respect to the unetched surface of the sapphire substrate 111, the sidewalls may be oriented between 0° and 90°, or between approximately these values, according to some embodiments. In some cases, the sidewalls may be oriented between 60° and 80°, or between approximately these values. In some cases, the sidewalls may be oriented between 65° and 75°, or between approximately these values. The slope of the etched sapphire sidewalls 212 may be controlled by adjusting the etch rate of the resist 210 (e.g., adjusting a concentration of etchant for the resist) and/or adjusting the slope of the sidewalls 215 of the resist 210 (e.g., adjusting exposure and development conditions for patterning the resist) and/or adjusting etch parameters for the sapphire etch.

According to some embodiments, a spacing or pitch P of the trenches etched into the sapphire may be between 0.25 micrometers (μm) and 10 μm, or between approximately these values. In some embodiments, the spacing between trenches may not be periodic. According to some embodiments, an etch depth D of the trenches may be between 50 nanometers (nm) and 2 μm, or between approximately these values. The width of the trenches may be approximately equal to, or equal to, one-half the pitch P, in some embodiments. In other embodiments, the width of the trenches may be greater than, or less than, one-half the pitch P. After etching the trenches, any remaining resist may be removed from the substrate 111 using a dry etch, a solvent, or a substrate cleaning process that dissolves the resist 210.

Figure 2D:
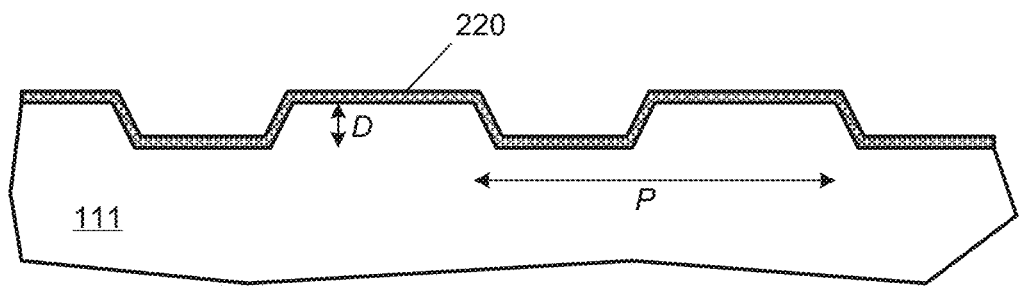
FIGS. 2D, 2E, 2F, and 2G depict structures associated with a process for masking selected surfaces of a patterned sapphire substrate in accordance with some embodiments of the present disclosure.

As illustrated in FIG. 2D, a high-temperature conformal coating 220 may be formed over the surface of the substrate 111 in some embodiments. The high-temperature conformal coating 220 may comprise an oxide (e.g., a silicon oxide) and/or a nitride (e.g., a silicon nitride). In some embodiments, the high-temperature conformal coating 220 and may be formed by a high-temperature conformal deposition process. The temperature during deposition may be between 300° C. and 1000° C., or between approximately those temperatures. For example, an oxide may be deposited by a chemical vapor deposition (CVD) process, such as plasma-enhanced chemical vapor deposition (PECVD). In some implementations, the high-temperature conformal coating 220 may be deposited by an atomic layer deposition (ALD) process. The thickness of the conformal coating 220 may be between 10 nm and 50 nm, or between approximately these values, according to some embodiments. The conformal coating 220 may cover one or more patterned surfaces of the substrate 111. In some embodiments, the conformal coating 220 may cover all of the patterned surfaces of the substrate 111 as depicted in FIG. 2C. A conformal coating may have a uniform thickness, irrespective of the substrate surface's orientation, unlike a coating produced by e-beam evaporation, for example.

Figure 2E:
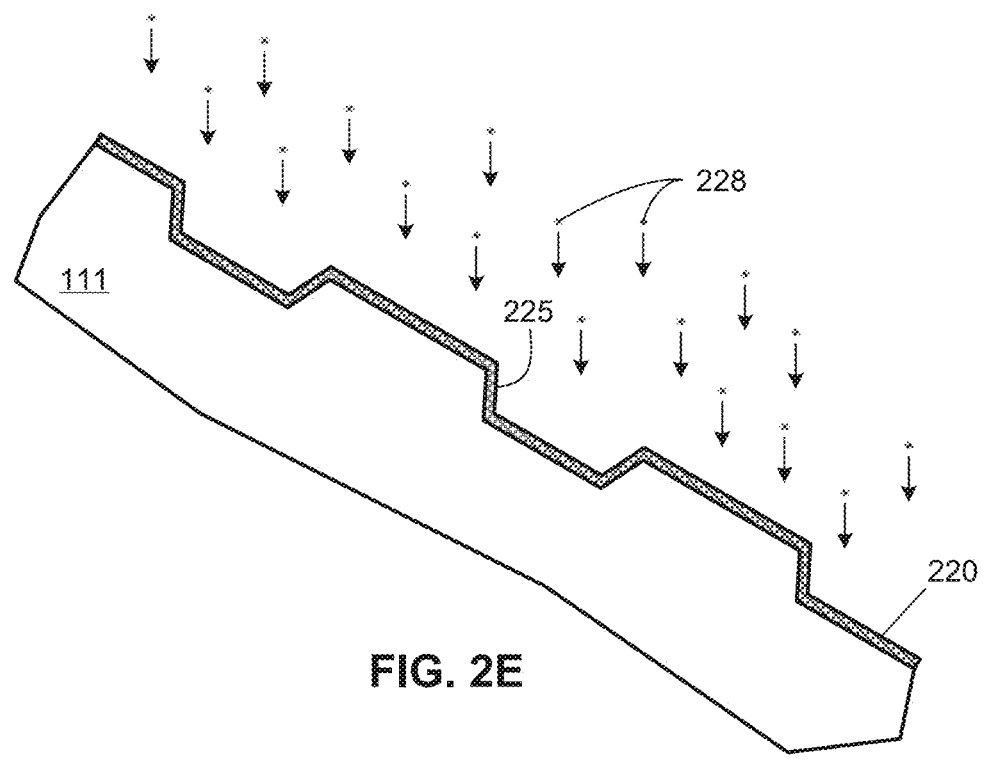
Figure 2F:
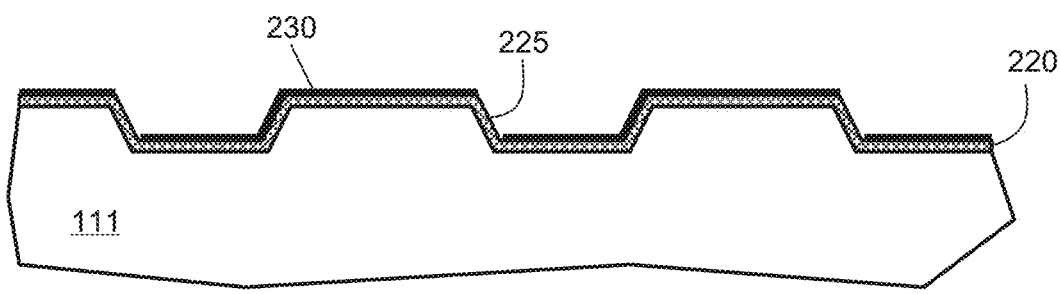

In some embodiments, a shadow evaporation may be performed to form a resist 230 over one or more portions of the high-temperature conformal coating 220. For example, as illustrated in FIGS. 2E-2F, the substrate 111 may be inclined at an angle with respect to a target in an electron-beam evaporation system. During the evaporation, evaporants 228 may be incident on exposed surfaces of the high-temperature conformal coating 220. One or more of the surfaces of the high-temperature conformal coating 220 (e.g., "shadowed surfaces" 225) may be hidden or screened from the incident evaporants 228 by an overlying surface. These shadowed surfaces 225 may not be coated by the evaporants 228. The evaporants may comprise metal (e.g., any one or combination of Cr, Ni, Al, Ti, Au, Ag) or any other material that may be used as evaporants.

In some embodiments, photolithography may be used to form a resist over selected surfaces of the conformal coating 220. Photolithography may involve several processing steps (e.g., resist deposition, exposure, and developing), and may involve an alignment of a photomask to the substrate features.

Figure 2G:
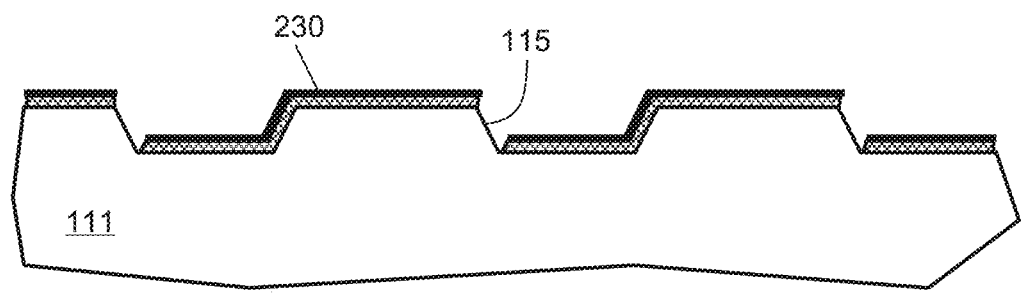

In some embodiments, a shadow evaporation may be used to form a hard resist 230 over selected surfaces of the coating 220 in one step without the need for alignment of a mask to the substrate, resulting in a structure as depicted in FIG. 2F. The shadowed surfaces 225, screened from the evaporant, may have an exposed oxide layer 220 covering the c-plane surfaces of the patterned sapphire substrate, but not include an overlayer of metal or other protective resist 230. A selective anisotropic dry etch may then be performed to remove the coating 220 from the shadowed surfaces 225 and expose the underlying sapphire. The dry etch may comprise a fluorine-based etchant for etching coating 220, according to some embodiments. The etching may expose the underlying crystal-growth surfaces 115 of the patterned sapphire substrate, as depicted in FIG. 2G. In some embodiments, a wet etch (e.g., a buffered oxide etch) may be used to remove an oxide coating 220 from the surface 225. In some implementations, a wet or dry etch may not be selective, and may be a timed etch. An etch that removes the coating 220 may, in some cases, partially etch the sapphire after removing the coating.

According to some embodiments, the resist 230 may be removed with a dry or wet etch process and/or a substrate-cleaning process. For example, a hard coating of metal (e.g., Cr) may be removed with a suitable metal etchant. In some implementations, the substrate may be cleaned in preparation for epitaxial growth of III-nitride material. For example, the substrate may be cleaned in acetone, methanol, and a piranha solution before loading into a metal-organic chemical vapor deposition reactor for subsequent crystal growth.

In some embodiments, a buffer layer may be formed at the exposed crystal-growth surfaces 115 of the patterned substrate 111 to facilitate growth of semipolar III-nitride materials of integrated-circuit-grade quality and of a desired polarity. The buffer layer may be formed utilizing one or more buffer layer processes to provide suitable growth of semipolar GaN of a desired polarity from the patterned substrate 111, such as a low-temperature (LT) aluminum nitride (AlN) process, a high-temperature AlN process, a low-temperature GaN buffer layer process, a low temperature AlGaN buffer layer process, etc.

For example, gallium-polar semipolar GaN may be grown from the patterned substrate 111 utilizing a first buffer-layer process. In the first buffer-layer process, the substrate 111 may be subjected to a cleaning process followed by a low-temperature GaN buffer layer growth process, which may be carried out in the same growth reactor. The cleaning process may comprise heating the substrate to between 1000° C. and 1200° C., or between approximately these values, in a hydrogen ($H_2$) ambient or any other suitable ambient. In some embodiments, the buffer layer may be formed under GaN epitaxial growth conditions at temperatures between 400° C. and 650° C., or between approximately these values.

According to some embodiments, the low-temperature GaN buffer layer may be formed at a temperature of approximately 500° C. In some cases, the chamber pressure may be maintained between 50 mbar and 400 mbar, or between approximately these values. A flow rate of $NH_3$ may be between 1 slm and 4 slm, or between approximately these values, and a flow rate of trimethylgallium (TMGa) may be between 5 sccm and 50 sccm, or between approximately these values. The buffer layer may be grown to a desired thickness. For example, a thickness of the buffer layer may be between 10 nm and 50 nm, or between approximately these values, in some embodiments.

In some embodiments, a low-temperature GaN buffer layer heated to above 900° C. may diffuse more readily than a low-temperature AlN layer. In some embodiments, a low-temperature GaN buffer layer may migrate and redistribute from other oxide-covered surfaces of the substrate 111 to the exposed c-plane crystal-growth surfaces 115. This redistribution can promote selective growth of GaN at the crystal-growth surfaces. In some implementations, a low-temperature AlN buffer layer may be used prior to forming gallium-polar semipolar GaN. For example, the first buffer layer process above may be used with trimethylaluminum (TMAl) substituted for TMGa.

After growth of a low-temperature buffer layer according to the first buffer layer process, the temperature of the substrate may be ramped up for high-temperature growth of gallium-polar semipolar GaN from the crystal-growth surfaces. According to some embodiments, the low-temperature GaN buffer layer may be annealed for a period of time at a temperature between 850° C. and 1150° C., or between approximately these values, prior to introducing reactants for GaN growth. The annealing period may be between 1 minute and 10 minutes, or between approximately these values. High-temperature growth of gallium-polar semipolar GaN, for example, may occur at temperatures between 900° C. and 1150° C., or between approximately these values according to some implementations.

As another example, a second buffer layer process may be used to form nitrogen-polar semipolar GaN from the crystal growth surfaces 115. In the second buffer layer process, the substrate 111 may be thermally cleaned as described for the first buffer layer process. A nitridation process may then be performed to nitridate exposed crystal-growth surfaces 115. According to some embodiments, the nitridation process may comprise heating the substrate 111 to a temperature between 850° C. and 1110° C., or between approximately these values, in an ambient comprising a mixture of nitrogen ($N_2$) and ammonia ($NH_3$) gases. The $N_2$ flow rate may be between 2 slm and 8 slm, or between approximately these values. The $NH_3$ flow rate may be between 1 slm and 6 slm, or between approximately these values. The duration of nitridation may be between 0.5 minute and 5 minutes, or between approximately these values. Because of the nitridation, growth from the c-plane sapphire at the crystal-growth surfaces 115 would be least favorable compared to other surfaces of the patterned sapphire substrate 111. Therefore, the masking layer 140 (e.g., conformal oxide coating 220) may be formed to prevent unwanted crystal growth at the other sapphire surfaces.

Following nitridation, the substrate 111 may be subjected to a low-temperature GaN buffer layer process during which the substrate is heated to between 400° C. and 650° C., or between approximately these values in some implementations. In some cases, the substrate 111 may be heated to approximately 500° C., and the chamber pressure may be maintained between 100 mbar and 300 mbar, or between approximately these values. A flow rate of $NH_3$ may be between 0.5 slm and 5 slm, or between approximately these values. The flow rate of trimethylgallium (TMGa) may be between 5 sccm and 50 sccm, or between approximately these values. The LT GaN buffer layer may be grown to a thickness between 20 nm and 100 nm, or between approximately these values. In some embodiments, the buffer layer may be grown to a thickness greater than 50 nm and less than 100 nm. Improved growth conditions for nitrogen-polar semipolar GaN are found when the LT GaN buffer layer is formed under the following conditions: the chamber pressure is approximately 200 mbar, the $NH_3$ flow rate is approximately 1 slm, the Ga flow rate is approximately 40 sccm, and the buffer layer is grown to a thickness of approximately 80 nm.

After growth of a low-temperature GaN buffer layer according to the second buffer layer process, the temperature of the substrate may be ramped up for high-temperature growth of nitrogen-polar semipolar GaN from the crystal-growth surfaces. In some implementations, the low-temperature GaN buffer layer may be annealed prior to high-temperature growth of nitrogen-polar semipolar GaN material. The inventors have found improved results for subsequent growth of the nitrogen-polar semipolar GaN when the anneal time for the low-temperature GaN buffer layer is reduced compared to that used for growing gallium-polar semipolar GaN by up to a factor of three. During the anneal, the $H_2$ flow rate may be between 2 slm and 8 slm, or between approximately these values. The $NH_3$ flow rate may be between 0.5 slm and 6 slm, or between approximately these values. The duration of annealing may be between 0.5 minute and 3 minutes, or between approximately these values. The anneal temperature may be between 850° C. and 1150° C., or between approximately these values.

A difficulty of growing nitrogen-polar semipolar GaN from a low-temperature GaN buffer, as compared to growing gallium-polar semipolar GaN, is attributed to different transformations that occur during annealing of the buffer layers based on the polarities of the buffers, and the selectivity processes that occur on patterned sapphire substrates. For example, a Ga-polar GaN low-temperature GaN buffer layer may undergo a ripening recrystallization phase during annealing (which can be indicated by a nose-like peak in in-situ reflectance traces). During the recrystallization phase, decomposition and redeposition of the GaN may occur, which can favor the growth of Wurtzite phase nuclei on the substrate.

In contrast, and as can be seen by reflectance measurements, an N-polar GaN buffer layer may not undergo such a transformation, so that high-temperature GaN growth may proceed without a roughening-recovery phase with instant oscillations. For N-polar GaN, inspection of a buffer layer and initial growth stages by scanning-electron microscopy (SEM) and atomic-force microscopy (AFM) show an enhanced decomposition of the buffer layer. A rate-limiting process of GaN decomposition may be attributed to the formation of GaN at the substrate surface. The difference in decomposition rate between gallium and nitrogen polarities may be attributed to the bond configurations in the crystal structure, where in each bilayer the metal ion has only one back bond to nitrogen atoms (case of nitrogen-polarity) instead of three bonds (gallium-polarity). For a Ga-polar GaN buffer layer, an enabling factor for uniform crystal growth is redistribution of the low-temperature-GaN buffer layer onto the c-sapphire crystal-growth surfaces during annealing. Since redistribution does not occur readily with a nitridized sapphire surface and N-polar low-temperature-GaN buffer layer, sparse nucleation can result, and has been observed by the inventors. To improve subsequent crystal-growth uniformity for the N-polar case, the buffer layer thickness may be increased and the buffer layer anneal time may be reduced.

According to some embodiments, a buffer layer may be formed from a material different than a subsequently-grown material. For example, a buffer layer may be formed from any suitable III-nitride alloy (e.g., AN, InN, AlGaN, InGaN, InAlGaN), whereas a subsequently-grown epitaxial layer may comprise GaN or other III-nitride material. In some implementations, a buffer layer may be formed from GaN, and a subsequently-grown semipolar epitaxial layer may comprise any other suitable III-nitride alloy. The formation of other semipolar materials may require the addition or substitution of other reactants, such as trimethylaluminum (TMAl) or triethylaluminum (TEAl) as sources of aluminum and trimethylindium (TMIn) or triethylindium (TEIn) as sources of indium. Reactants used for forming GaN epilayers may include triethylgallium (TEGa) or trimethylgallium (TMGa). The flow rates for these gases may be between 5 sccm and 300 sccm during growth or regrowth of a semipolar III-nitride epilayer.

Figure 2H:
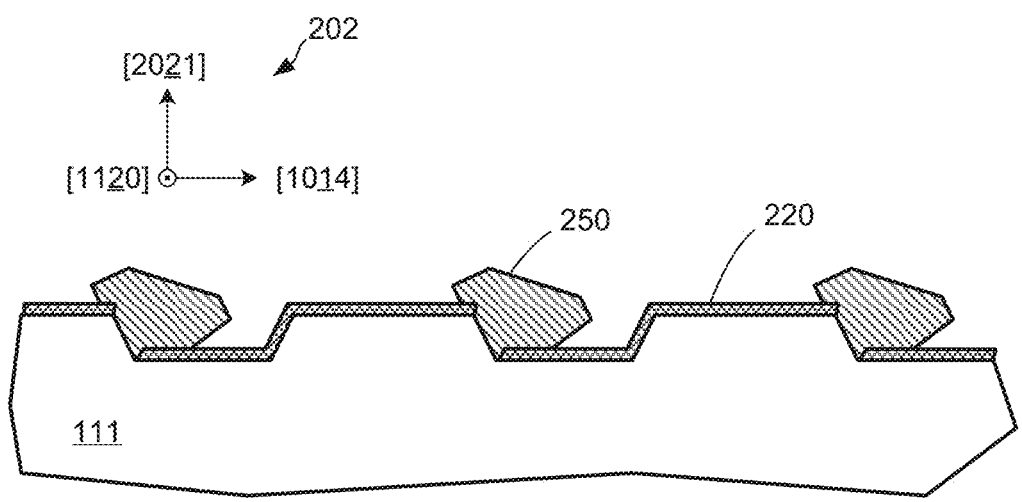
FIG. 2H depicts structures associated formation of a semiconductor layer in accordance with some embodiments of the present disclosure.

After the formation of a buffer layer, epitaxial growth of a semipolar III-nitride material may be carried out. As growth of semipolar III-nitride material (e.g., gallium-polar semipolar GaN) proceeds from the crystal-growth surfaces 115, islands of III-nitride crystals 250 may form across the surface of the patterned sapphire substrate 111, as depicted in FIG. 2H. Because of the inclination of the crystal growth surfaces 115 with respect to the patterned substrate 111, the III-nitride crystals 250 may grow with a selected crystallographic plane in a direction that is parallel to the original planar surface of the patterned substrate 111. Examples of the selected crystallographic plane may include (20$\overline{2}$1) (e.g., for gallium-polar semipolar GaN), (20-2-1) for nitrogen-polar semipolar GaN). Crystallographic orientations for nitrogen-polar semipolar GaN crystals 250 are depicted by the axes 202 in FIG. 2H.

The epitaxial growth process for a group III-nitride material, after formation of the buffer layer, may comprise metal-organic chemical-vapor deposition (MOCVD), according to some embodiments. In some embodiments molecular-beam epitaxy (MBE) or hydride vapor phase epitaxy (HVPE) processes may be used. To form relatively thin layers, atomic layer deposition may be used. In an exemplary MOCVD process, the growth conditions may comprise a growth temperature between 980° C. and 1070° C., or between approximately those temperatures, and a chamber pressure between 50 mbar and 300 mbar, or between approximately those pressures. The flow rate of $NH_3$ gas may be between 0.5 slm and 4 slm, or between approximately those flow rates. The flow rate of trimethylgallium or triethylgallium may be between 10 sccm and 50 sccm, or between approximately those flow rates.

Figure 2I:
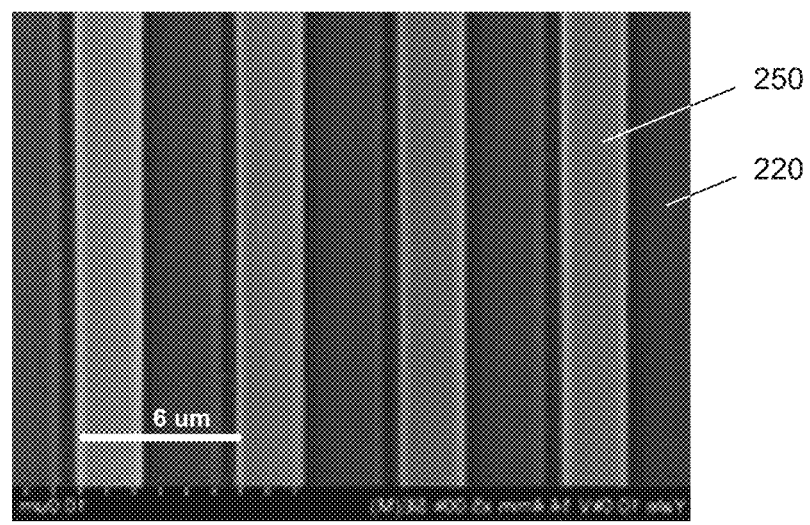
FIG. 2I is a scanning-electron micrograph showing gallium-polar semipolar GaN stripes formed on a portion of a patterned sapphire substrate in accordance with some embodiments of the present disclosure.

FIG. 2I is a scanning electron micrograph showing, in plan view, examples of gallium-polar semipolar GaN crystals 250 grown from a masked and patterned sapphire substrate, according to some embodiments. The patterned sapphire substrate comprises crystal-growth surfaces 115 spaced approximately 6 μm apart, and the etch depth D of trenches in the sapphire substrate is approximately 1 μm. The crystal-growth surfaces are oriented at approximately θ=75° with respect to the process surface of the substrate. Other surfaces on the patterned sapphire substrate were masked with a PECVD oxide, as described above in connection with FIGS. 2D-2G. A low-temperature GaN buffer layer approximately 20 nm thick was formed, without nitridation, on the crystal growth surfaces 115 of the substrate. In other embodiments, a low-temperature AlN buffer may be used. The growth conditions for the GaN buffer layer were: pressure of approximately 200 mbar, temperature of approximately 500° C., an NH3 flow of approximately 1 slm, and a TMGa flow rate of approximately 40 sccm. For a low-temperature AlN buffer layer, a TMAl flow rate of approximately 25 sccm may be used. Subsequently, gallium-polar semipolar GaN was grown under the following epitaxial growth conditions: a growth temperature of approximately 1030° C., a growth pressure of approximately 100 mbar, a flow rate of TMGa of approximately 40 sccm TMGa, and a flow rate of $NH_3$ at about approximately 1 slm. The micrograph in FIG. 2I shows that bars of GaN crystal 250 may be grown from the crystal-growth surfaces 115 with high spatial uniformity.

Epitaxial growth may be continued so that the III-nitride crystals 250 coalesce to form a continuous epitaxial semiconductor layer 120 over the patterned substrate 111 (e.g., as illustrated in FIG. 2A).

Figure 3:
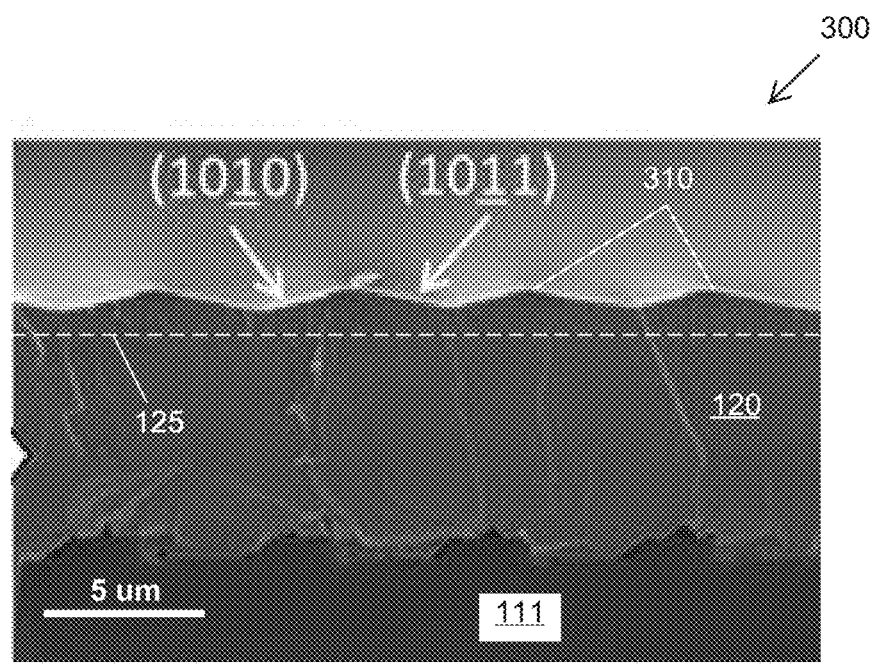
FIG. 3 is a scanning-electron micrograph showing a cross-section view of coalesced semipolar GaN formed on a patterned sapphire substrate in accordance with some embodiments of the present disclosure.

FIG. 3 is a scanning electron microscope (SEM) image of a growth template 300 for fabrication of group III-nitride materials according to some embodiments of the present disclosure. As illustrated, growth template 300 may include a semiconductor layer 120 of group III-nitride materials formed on a substrate 111. The semiconductor layer may include an epitaxial layer of semipolar group III-nitride materials (e.g., semipolar GaN). The semiconductor layer 120 may contain coalesced group III-nitride materials (e.g., coalesced semipolar GaN). The semiconductor layer 120 may have a suitable thickness. For example, a thickness of the epitaxial layer 120 may be approximately 8 microns. A thickness of the coalesced epitaxial layer may be between 100 nm and 20 microns, in some embodiments. In some embodiments, thicker layers of group III-nitride materials may be grown.

As illustrated in FIG. 3, an upper surface of the epitaxial layer 120 may have ridges 310 in some implementations. The ridges 310 may run parallel to the crystal growth surfaces 115. The formation of the ridges 310 may result from intersections of crystallographic growth planes of the group III-nitride materials (e.g., the (10$\bar{1}$0) and (10$\bar{1}$1) planes for growth of gallium-polar semipolar GaN). The formation of the ridges 310 may depend on a specific semipolar or nonpolar crystallographic orientation of the group III-nitride materials. For example, the ridges 310 may represent intersections of the (10$\bar{1}$0) and (10$\bar{1}$1) planes for growth of gallium-polar semipolar GaN (e.g., (20$\bar{2}$1) GaN).

In some embodiments, the growth template 300 may be planarized to form a process surface 125. The growth template 300 may be planarized using any suitable planarization techniques, such as chemical-mechanical polishing, grinding and polishing, etc. In some embodiments, the process surface 125 may be parallel to or approximately parallel to a semipolar crystallographic plane of the semiconductor layer 120 (a (20$\bar{2}$1) plane of the GaN semiconductor). In some embodiments, the process surface 125 may be inclined at an angle with respect to the semipolar crystallographic plane of the semiconductor layer 120.

Figure 4A:
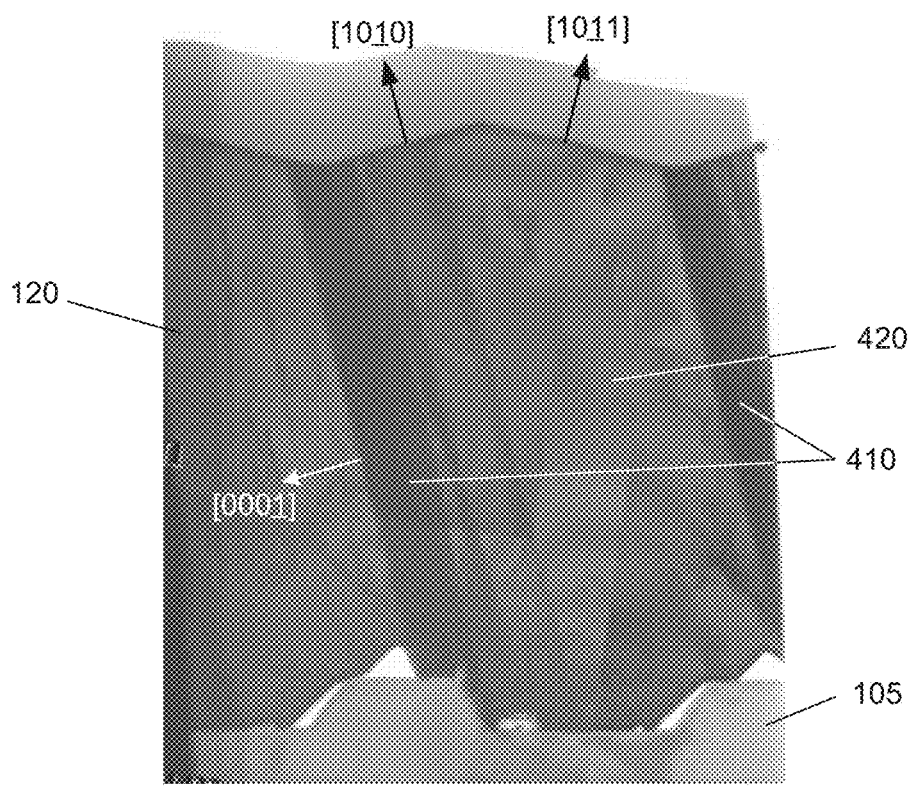
FIG. 4A is a transmission-electron micrograph showing stacking faults in a coalesced epitaxial layer of GaN on a patterned sapphire substrate in accordance with some embodiments of the present disclosure.

Stacking faults may occur in one or more regions of the epitaxial layer 120 when the epitaxial layer 120 is formed on the substrate 111. For example, as illustrated in FIG. 4A, regions 410 of the epitaxial layer may contain stacking faults (also referred to as the "stacking-fault regions"). In some embodiments, the stacking faults may occur as the GaN crystal grows in the [000$\bar{1}$] direction along a heterogeneous interface. Stacking-fault regions 410 may form as the islands of III-nitride crystals 250 grow from the crystal growth surfaces 115 on the substrate 111 over masked regions of the substrate 111 in the [000$\bar{1}$] direction. The stacking-fault regions 410 may be separated by uniform regions 420 where the crystal forms in other directions and is free of or substantially free of stacking faults. In some embodiments, certain defects may be present in the uniform regions 420 at considerably lower density (e.g., having a density lower than a threshold).

Figure 5:
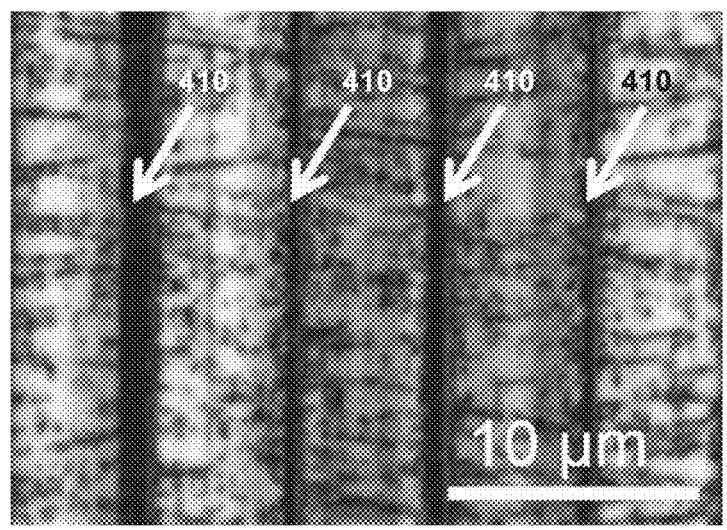
FIG. 5 shows a cathodoluminescence image recorded from a coalesced epitaxial layer of semipolar GaN formed on a patterned sapphire substrate, according to some embodiments of the present disclosure.

The stacking faults may also be observed using cathodoluminescence (CL) measurements of an area of the epitaxial layer. In a CL measurement, energetic electrons impinge on the epitaxial layer and cause the layer to luminescence. Regions that contain defects may not luminesce and appear dark when viewed microscopically. FIG. 5 shows a cathodoluminescence (CL) image of a gallium-polar semipolar GaN epitaxial layer formed on a patterned sapphire substrate. As shown, the stacking fault regions 410 appear as dark bands running across the surface of the substrate. The spacing of the dark bands is approximately equal to the spacing of the crystal growth surfaces 115 on the patterned surface.

Figure 4B:
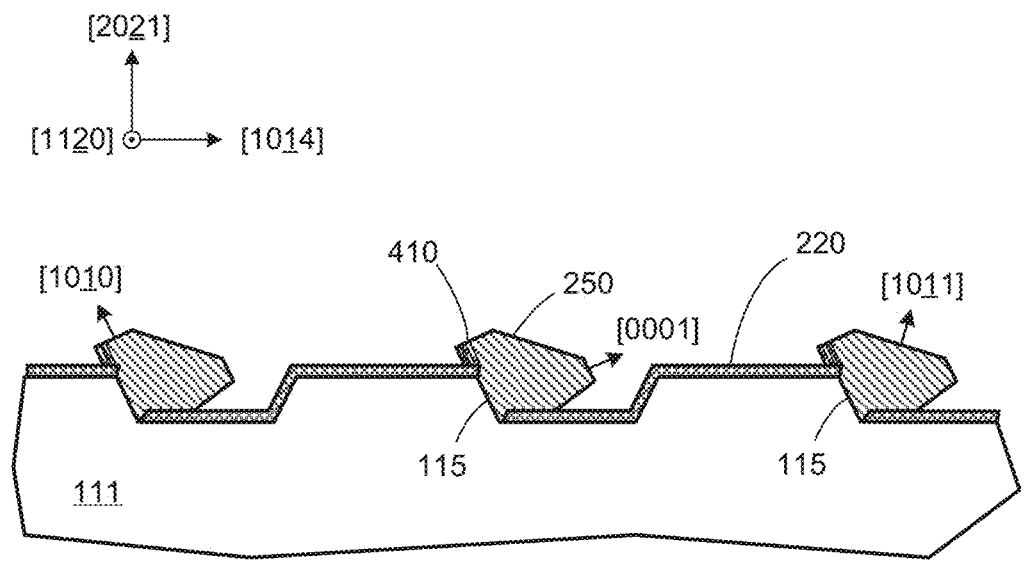
FIG. 4B depicts formation of semipolar group III-nitride crystals on growth surfaces of a patterned foreign substrate in accordance with some embodiments of the present disclosure.

The stacking faults may adversely affect semiconductor devices fabricated on the epitaxial layer 120. One or more of the stacking-fault regions 410 may be minimized and/or eliminated using one or more processing techniques in accordance with the present disclosure. For example, the growth of the epitaxial layer 120 may be terminated after the stacking-fault regions have formed. The stacking-fault regions 410 may be removed (e.g., selectively etched away). The removal of the stacking-fault regions 410 may form one or more voids in the epitaxial layer 120. A subsequent selective-growth process may then be used to regrow the group III-nitride material to fill the voids. The selective-growth process may involve accelerating growth rates of one or more undesirable facets (e.g., the (0001) facets in the example of FIG. 4A and FIG. 4B) over the growth rate of other crystal growth facets (e.g., the (10$\bar{1}$0) and (10$\bar{1}$1) facets in this example). According to the Wulff principal, the crystal facets with the highest growth rate will terminate more quickly than facets with lower growth rates, and the crystal shape will be dominated by the facets with the lower growth rates. Elimination of the (000$\bar{1}$) growth facets can remove it as a source of stacking-fault formation.

Figure 6A:
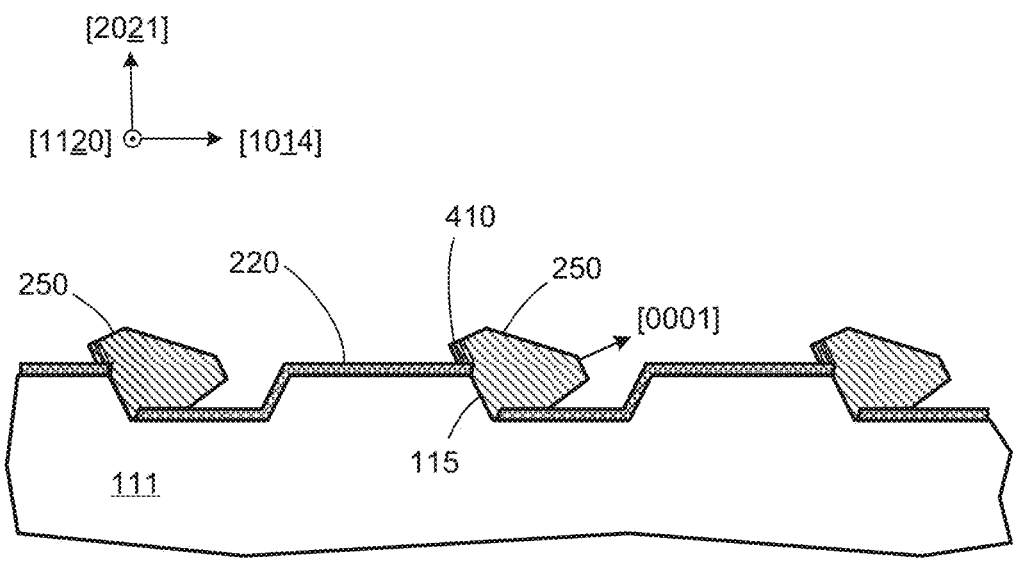
FIGS. 6A, 6B, and 6C illustrate structures associated with growth of semipolar group III-nitride crystals from growth surfaces of a patterned sapphire substrate in accordance with some embodiments of the present disclosure.
Figure 6B:
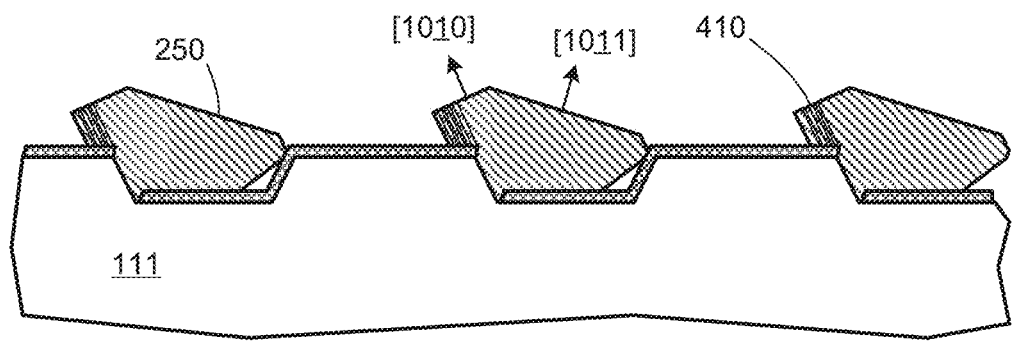
Figure 6C:
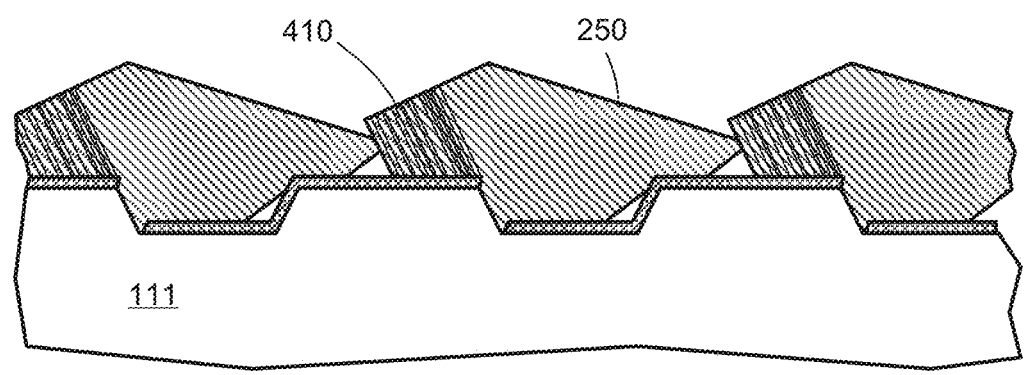

FIGS. 6A-6E show structures associated with a process for removing stacking-fault regions in epitaxial layers of III-nitride material formed over a foreign substrate. Although the example shown continues with a same semipolar orientation of GaN described above, the embodiments are not limited to only the depicted semipolar orientation. The processing steps may be applied to other orientations of group III-nitride materials (e.g., GaN) including nonpolar orientations. The other orientations may include, for example, (11$\bar{2}$2), (11$\bar{2}$0), (10$\bar{1}$1), (10$\bar{1}$0), and (30$\bar{3}$1) orientations. In some embodiments, facet orientations within 60 degrees of a nonpolar facet orientation, or approximately within this value, may be desirable for semiconductor device applications such as LEDs, lasers, and transistors As illustrated in FIG. 6A, as the III-nitride crystals 250 grow as described in connection with FIGS. 2A-5, stacking-fault regions 410 may form in the [0001 ] direction along the (0001) facet. As the crystals 250 increase in size, well-defined facets may form on upper surfaces of the crystals. The facets may have various orientations. For example, as illustrated in FIG. 6B, the (1010) and (1011) facets may form on the upper surfaces. The stacking-fault regions 410 may increase in size as the group III-nitride crystals 250 expand across the substrate 111. Facets of various orientations may have different quantities and/or densities of stacking faults. For example, the semiconductor that forms in the [0001] direction may have significantly fewer or negligible stacking faults compared to the semiconductor that forms in the [0001 ] direction. In one implementation, the epitaxial growth of the group III-nitride material may continue until the group III-nitride crystals 250 coalesce, as depicted in FIG. 6C. In another implementation, the group III-nitride crystals 250 do not have to coalesce.

After the formation of stacking-fault regions 410, the growth of the group III-nitride materials may be terminated. The substrate 111 and/or crystals 250 may be selectively etched to remove the stacking faults and/or to reshape the group III-nitride crystals 250. For example, the selective etch may be and/or include a wet, anisotropic etch that may etch certain facets of a formed crystal 250 and stops on other facets of the crystal 250. For example, a wet potassium hydroxide (KOH) etch may be employed. The KOH concentration may be between 5% and 50% KOH in water by weight, or between approximately these values. The KOH solution may be heated to a suitable temperature (e.g., a temperature between 20° C. and 80° C., or between approximately these values). In some implementations, the KOH concentration may be between 20% and 50% KOH, or between approximately these values, in water by weight and the etching temperature may be between 30° C. and 80° C., or between approximately these values. The etching time may be between 1 minute and 60 minutes, depending on the size of the crystals 250, the etchant concentration, and the etching temperature. In some implementations where the same or different crystal orientations may be desired, other etchants may be used such as, but not limited to, sodium hydroxide (NaOH), sulfuric acid ($H_2SO_4$), phosphoric acid ($H_3PO_4$).

Figure 6D:
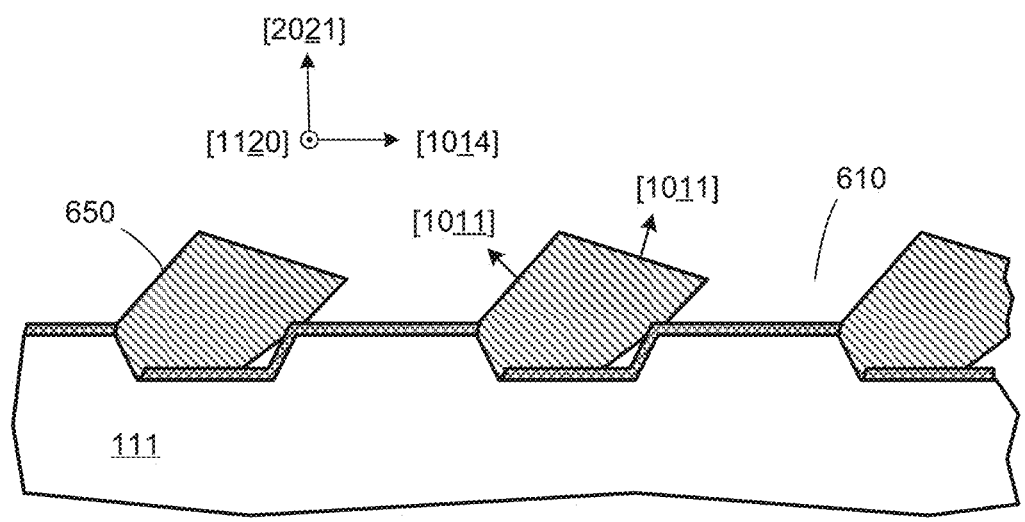
FIG. 6D depicts a structure of reshaped group III-nitride crystals in accordance with some embodiments of the present disclosure.

In some embodiments, the selective etch may stop on one or more facets of the crystal 250, so that the etch may self-terminate and the etch-back may not have to be precisely timed. For example, the KOH etch may rapidly etch the (000$\bar{1}$) facets of the crystals 250 and effectively stop on the (10$\bar{1}$0), (10$\bar{1}$1), and (10$\bar{1}$1) facets. In some implementations, the etch rates for the (10$\bar{1}$0), (10$\bar{1}$1), and (10$\bar{1}$1) facets may be slower (e.g., at least ten times slower) than the etch rate for the (000$\bar{1}$) facet. A resulting reshaped crystal structure (for gallium-semipolar GaN) is depicted in FIG. 6D. The remaining top-side facets may comprise the (10$\bar{1}\bar{1}$) facet and the (10$\bar{1}$1) facet, according to some embodiments. The removal of the stacking-fault regions 410 and/or reshaping of the crystals 250 may form one or more voids 610 between the reshaped crystals 650. After the etch back and removal of the stacking-fault regions 410, the substrate may be cleaned in deionized water and a selective-growth process may be employed to regrow the group III-nitride material (e.g., GaN) on the reshaped crystals 650. The selective-growth may include growing GaN in which the growth rate of a selected facet is made faster than one or more other growth facets. Since the stacking faults are generated in the (000$\bar{1}$) basal-planes of GaN during initial growth of this facet, it is desirable to reduce or eliminate (000$\bar{1}$) basal-plane growth facet during regrowth in order to get rid of the stacking faults.

According to the theory of kinetic Wulff-plot, during the convex growth of a crystal, the facets with fast growth rates will disappear and the crystal shape will be dominated by the facets with slow growth rates. To eliminate and/or minimize facets that are associated with stacking faults (e.g., the (000$\bar{1}$) facets) during the regrowth, the facets associated with the stacking faults and the facets associated with no or negligible stacking faults may be grown at various grown rates. For example, a first facet associated with a first density of stacking faults may be grown at a first growth rate while a second facet associated with a second density of stacking faults may be grown at a second growth rate. The first density of stacking faults may be greater than the second density of stacking faults. The first growth rate may be faster than the second growth rate. In some embodiments, the first facet may include the (000$\bar{1}$) facet. The second facet may include, for example, the (10$\bar{1}$1) facet.

Figure 6E:
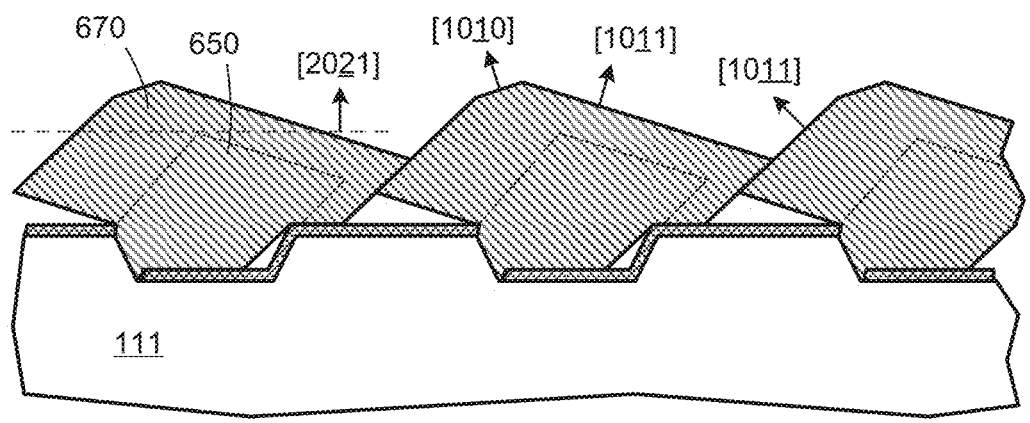
FIGS. 6E and 6F depict examples of a regrown layer of semipolar group III-nitride materials in accordance with some embodiments of the present disclosure.
Figure 8:
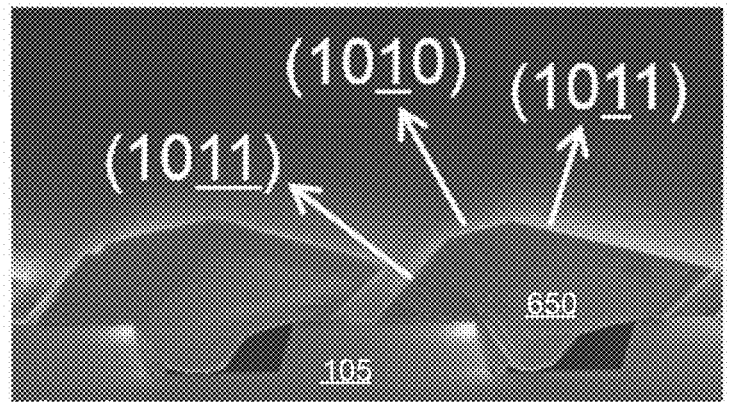
FIG. 8 is a scanning electron micrograph of gallium-polar semipolar GaN regrown on a patterned sapphire substrate in accordance with some embodiments of the present disclosure.

In some embodiments, the various growth rates may be achieved by accelerating the growth rate(s) of the facets associated with the stacking faults and/or reducing the growth rate(s) of the facets that are associated with no or negligible stacking faults. For example, the growth rate of the (000$\bar{1}$) facet may be increased relative to the growth rate of at least the (10$\bar{1}$1) facet, so that the shape of the crystal 250 may be dominated by the (10$\bar{1}$1) facet and/or other facets grown at a relatively slow rate. The growth rate of the N-polar (000$\bar{1}$) growth facet may be enhanced, for example, by adding in some impurity species during regrowth. Examples of the impurity species may include antimony (Sb), germanium (Ge), bismuth (Bi), etc. The resulting regrown crystals can then eliminate growth from a (000$\bar{1}$) facet and form with stable growth facets (10$\bar{1}$1), (10$\bar{1}$0), and (10$\bar{1}$1), as illustrated in FIG. 6E. Regrowth or continued growth portions 670 of the crystals may include the impurity dopant. An example SEM image, regrown, gallium-polar semipolar GaN on a PSS is shown in FIG. 8. According to some embodiments, the regrowth may continue until the voids 610 are covered and/or the reshaped crystals 650 grow until they coalesce.

In some embodiments, the regrowth of the group III-nitride material (e.g., GaN) may include growing the group III-nitride material using a metal-organic chemical vapor deposition (MOCVD) process. The MOCVD process may be carried out under certain growth conditions. For example, the regrowth temperature may be between 950° C. and 1070° C., or between approximately these values. The pressure may be between 50 mbar and 400 mbar, or between approximately these values. The TMGa or TEGa flow rate may be between 10 µmol/min and 200 µmol/min, or between approximately these values. The $NH_3$ flow rate may be between 0.5 slm and 5 slm, or between approximately these values. The impurity doping level may be between $1 \times 10^{17}$ $cm^{-3}$ and $5 \times 10^{19}$ $cm^{-3}$, or between approximately these values. For lower and higher doping levels, stacking faults were observed to form. According to some embodiments, the doping range may be between $1 \times 10^{18}$ $cm^{-3}$ and $1 \times 10^{19}$ $cm^{-3}$, or between approximately these values.

Figure 6F:
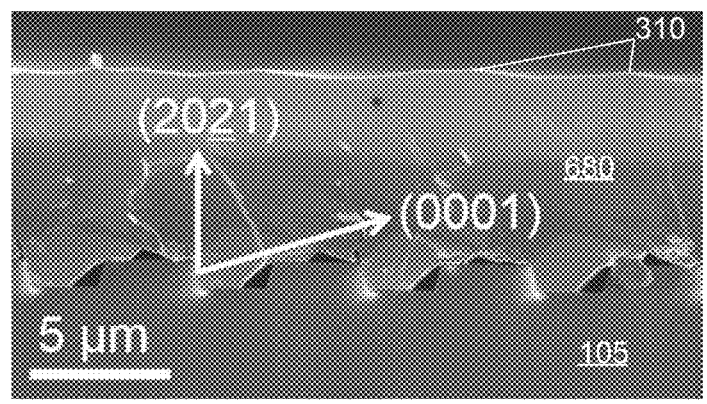

In some embodiments, the impurity doping may be discontinued after the reshaped crystals 650 coalesce during the regrowth. A layer of a desired III-nitride material may then be grown. A thickness of the layer may be, for example, between 2 microns and 20 microns. The resulting epitaxial layer 680 may have ridges 310 as shown in FIG. 6F, but may have a greatly reduced density of stacking faults compared to the case shown in FIG. 3. For example, the density of stacking faults for the sample shown in FIG. 3 may be as high as $1 \times 10^6$ $cm^{-2}$, and the density of stacking faults for epitaxial layers of III-nitride material produced according to the present embodiments may be no more than $10^2$ $cm^{-2}$. According to some embodiments, the substrate may be subsequently planarized (e.g., using chemical-mechanical polishing) to remove the ridges 310 and produce a planar process surface parallel to the (20$\bar{2}$1) gallium-polar semipolar facet, for example.

Figure 7A:
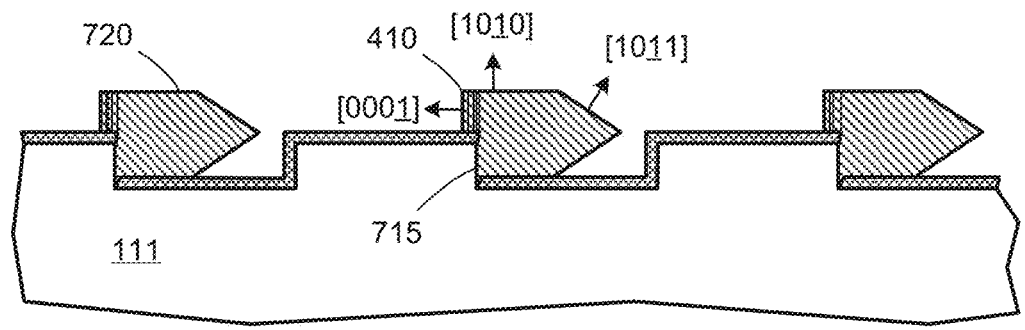
FIGS. 7A, 7B, and 7C illustrate structures associated with producing a substrate of nonpolar group III-nitride materials in accordance with some embodiments of the present disclosure.
Figure 7B:
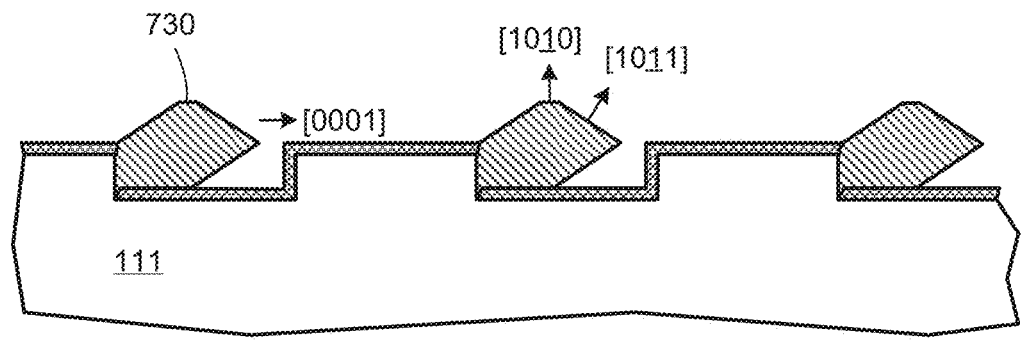
Figure 7C:
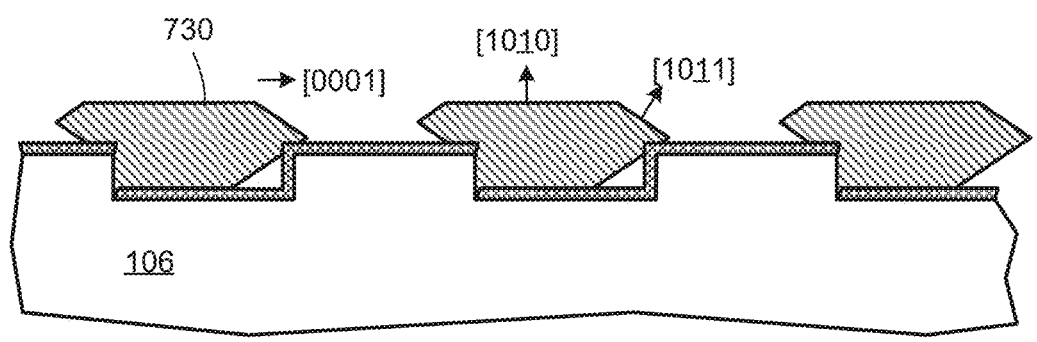

FIGS. 7A, 7B, and 7C show structures associated with forming nonpolar group III-nitride materials. To grow a group III-nitride material (e.g., GaN) with a nonpolar orientation, a sapphire substrate 111 may be selected with its c-plane oriented perpendicular to the substrate surface. The sapphire substrate 111 may be patterned with vertical sidewalls that are approximately parallel to the sapphire substrate's c-plane. As depicted in FIG. 7A, crystals 720 of nonpolar GaN may be formed using growth techniques as described above from the crystal growth surfaces 715. As the crystals 720 grow, stacking-fault regions 410 may form in the [000$\bar{1}$] direction as the crystal expands over the masked areas.

A subsequent etch may be performed to remove the stacking-fault regions 410 and to reshape the crystals, as depicted in FIG. 7B. The resulting growth facets may comprise the (10$\bar{1}$1), (10$\bar{1}$0), and (10$\bar{1}\bar{1}$) facets. A subsequent regrowth with an impurity dopant as described above may be carried out to form stacking-fault free crystals 730, as indicated in FIG. 7C. Growth of the stacking-fault free crystals 730 may continue until they coalesce over the substrate 111. The dopant may be terminated and a thick layer of stacking-fault-free, nonpolar GaN may be formed over the substrate 111.

Although two different crystal orientations are shown in FIG. 6E and FIG. 7C, a semiconductor crystal may be formed in any orientation from polar to nonpolar and a final crystal facet need not be parallel to a process surface of the finished substrate. Any selected crystal facet may be either parallel to or oriented at a desired angle with respect to the process surface. The orientation of the epitaxial crystals is primarily determined by the cut of the sapphire substrate. In one implementation, the etched sidewalls 112 of the sapphire substrate may be parallel to or approximately parallel to the c-plane facet of the sapphire substrate. In another implementation, the etched sidewalls 112 may be inclined at a certain angle (e.g., as much as 5 degrees) with respect to the c-plane facet of the sapphire substrate.

When nitrogen-polar orientations of a group III-nitride material, such as GaN, are formed, stacking faults may or may not form at the (000$\bar{1}$) growth facet. In a nitrogen-polar orientation, the (000$\bar{1}$) growth facet may form away from a masked region and not along its surface. Instead, the (0001) growth facet may form along a masked surface and generate stacking faults. Accordingly, an impurity dopant may be used to increase the growth rate of the (0001) growth facet. In some cases, Sb, Ge, Bi, etc. may be added as a dopant within the ranges specified above to eliminate the (0001) growth face.

FIG. 8 is a SEM micrograph showing regrown, stacking-fault free crystals of gallium-polar semipolar GaN on a patterned sapphire substrate 111. The resulting growth facets after etch-back and regrowth with a Sb, Ge or Bi dopant are the (10$\bar{1}$1), (10$\bar{1}$0), and (10$\bar{1}\bar{1}$) facets. Other orientations of the sapphire substrate may result in other resulting growth facets. For this example, the periodicity of patterns on the sapphire substrate 111 is approximately 6 microns. Other periodicities may be used in other embodiments. According to some implementations, the periodicity may be nanoscale, e.g., between 20 nm and 500 nm. With smaller periodicity, the portion of the epitaxial layer subjected to etch-back and regrowth with an impurity may be appreciably less than when the periodicity is on the order of 5 microns. A thinner portion of the GaN layer subjected to etch-back and regrowth may result in a lower defect density at the surface of a coalesced epitaxial layer that is microns thick.

Figure 9:
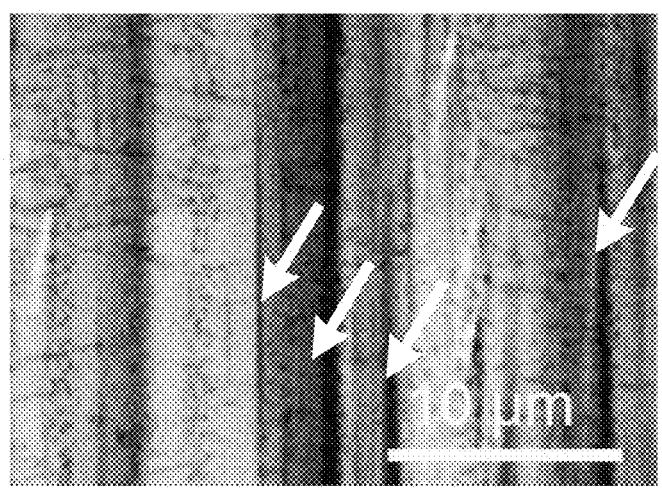
FIG. 9 shows a cathodoluminescence image recorded from a coalesced epitaxial layer of semipolar GaN formed on a patterned sapphire substrate in accordance with some embodiments of the present disclosure.

The crystalline quality of a 7-micron thick epitaxial layer of (20-21) GaN (shown in FIG. 6F) was characterized by cathodoluminescence (CL). A plan-view monochromatic CL image at emission wavelength of 365 nm is shown in FIG. 9. This image in comparison with the CL image of FIG. 5 shows that the periodic pattern of stacking faults (dark bands running across the GaN layer) is not present. The short discrete dark lines shown in FIG. 9 (marked by white arrows) may be associated with clusters of threading dislocations created at the interface between GaN and the sapphire substrate.

Although the methods and embodiments described above include steps of initial crystal growth, etch-back to remove stacking faults due the lateral growth of N-polar (000$\bar{1}$) GaN facet over a heterogeneous surface and to reshape the initial crystals, and further growth of the reshaped crystals with an impurity dopant, the etch-back process may be omitted in some embodiments. In some embodiments, the initial growth of crystals (e.g., crystals 250 in FIG. 6A) on a patterned sapphire substrate with a suitable buffer layer may be carried out with an impurity dopant such as Sb, Ge, Bi, etc. Initial growth with the impurity dopant may eliminate the (000$\bar{1}$) growth facet quickly and prevent the stacking fault regions 410 from forming during the initial stages of crystal growth. Instead, the initial crystals may form with the (10$\bar{1}$1), (10$\bar{1}$0), and (10$\bar{1}\bar{1}$) facets as depicted in FIG. 6D. Growth with the impurity dopant may continue until the crystals coalesce, as depicted in FIG. 6E for example. An initial portion of the epitaxial layer that includes the initial growth crystals may be doped with the impurity dopant. After the growth crystals coalesce, the dopant may be discontinued for subsequent III-nitride growth that is substantially free of stacking faults.

Figure 10:
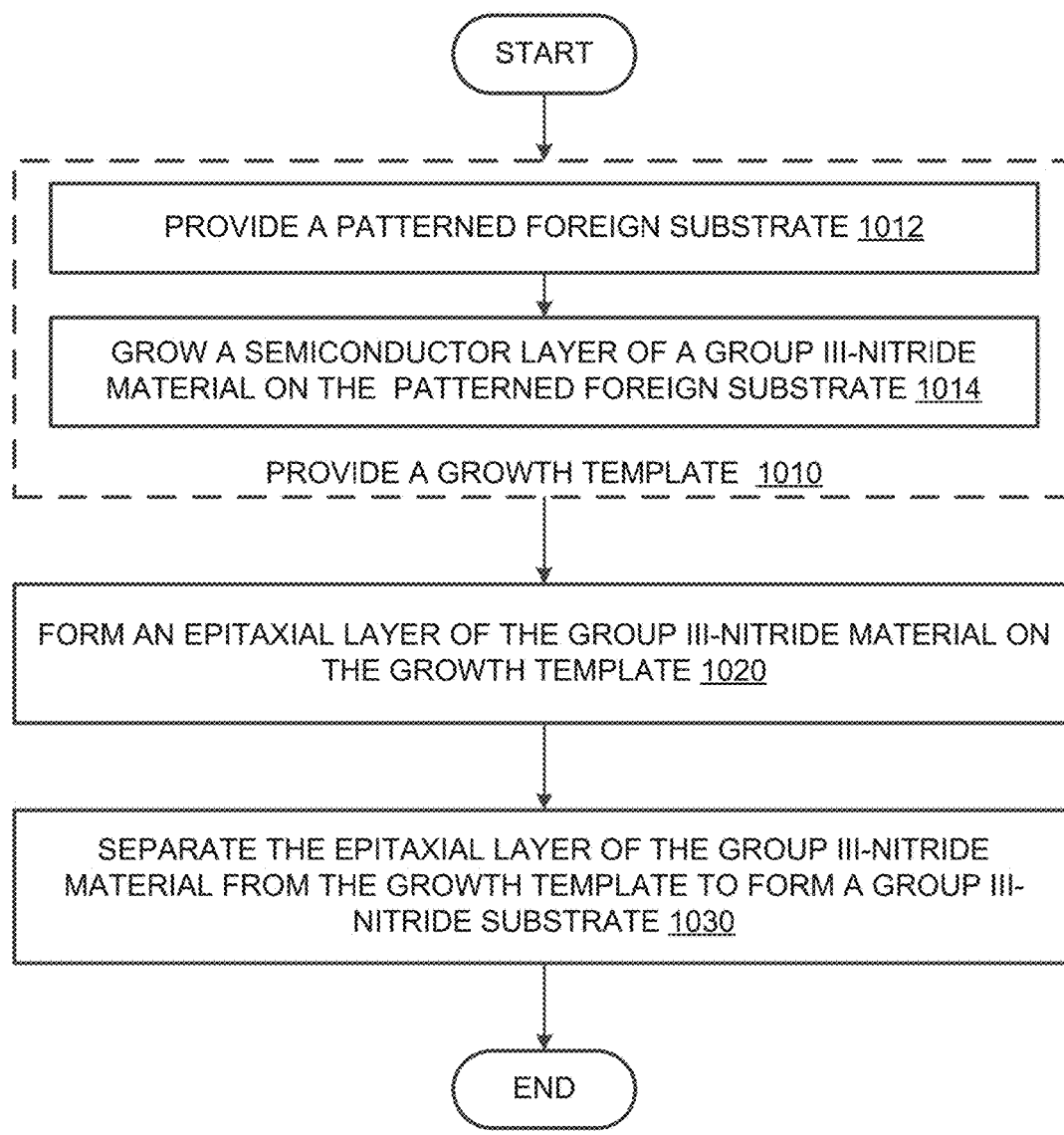
FIG. 10 is a flow diagram illustrating a method for producing a group III-nitride substrate according to some embodiments of the present disclosure.

FIG. 10 is a flow diagram illustrating an example 1000 of a method for producing a group III-nitride substrate according to some embodiments of the disclosure.

As illustrated, method 1000 may begin at block 1010 where a growth template may be provided for growing one or more group III-nitride materials. The growth template may include one or more layers of a group III-nitride material and/or any other suitable material. For example, the growth template may include an epitaxial layer of the group III-nitride material (e.g., GaN) formed on a foreign substrate (e.g., a sapphire substrate). In some embodiments, the growth template may be and/or include a growth template 110 as described in connection with FIGS. 1A-9 above.

In some embodiments, the growth template may be provided by performing one or more operations depicted in blocks 1012-1014.

At block 1012, a patterned foreign substrate may be provided. The patterned substrate may be formed using an initially unetched substrate. The orientation of the foreign substrate may be selected based on a desired crystallographic orientation of a semiconductor layer to be formed on the foreign substrate and/or an epitaxial relation between the semiconductor layer and the foreign substrate. For example, the foreign substrate may be cut so that a c-plane of the foreign substrate (e.g., a (0001) plane) is oriented with respect to a substrate surface (e.g., a top surface) of the foreign substrate to align with the (0001) plane of the semiconductor layer (e.g., the (0001) GaN plane) when a crystallographic plane of the semiconductor layer with the desired crystallographic orientation (e.g., the (20$\bar{2}$1) GaN plane) is parallel to the substrate surface. In a more particular example, a (22$\bar{4}$3) crystallographic plane of a sapphire substrate may be parallel to or approximately parallel to the substrate surface of the foreign substrate to facilitate growth of epitaxial layers of a group III-nitride material with a surface exposing a (20$\bar{2}$1) plane.

The patterned foreign substrate may include a plurality of surface structures (e.g., trenches and stripes) patterned across the substrate surface of the foreign substrate. The patterned foreign substrate may include one or more crystal-growth surfaces. The crystal-growth surfaces may be approximately parallel to a c-plane facet of the foreign substrate. In some embodiments, the foreign substrate may be provided by performing one or more operations described in connection with FIGS. 2A-2G above.

At block 1014, a semiconductor layer may be grown on the patterned substrate. The semiconductor layer may comprise one or more group III-nitride materials. The semiconductor layer may include one or more layers. For example, the semiconductor layer may include one or more buffer layers (e.g., an AlN buffer layer, a GaN buffer layer, an AlGaN buffer layer, etc.). As another example, the semiconductor layer may include an epitaxial layer of a group III-nitride material with a desired crystallographic orientation. In a more particular example, the semiconductor layer may include an epitaxial layer of semipolar or nonpolar GaN. A process surface of the semiconductor layer may be parallel to or approximately parallel to a semipolar plane or a nonpolar plane of the group III-nitride material (e.g., GaN). The process surface may be, for example, a surface of the semiconductor layer that does not contact the foreign substrate. The semiconductor layer may be free of or substantially free of stacking faults.

In one implementation, growing the semiconductor layer may include growing facets of various orientations at various growth rates. For example, one or more facets of an undesired orientation (e.g., an orientation associated with stacking faults) may be grown at a growth rate that is greater than that of one or more other facets. In some embodiments, the various growth rates may be achieved by doping the semiconductor layer with a suitable dopant (e.g., Sb, Ge, Bi, etc.). In another implementation, growing the semiconductor layer may include growing an initial layer of the group III-nitride material that includes stacking faults and removing the stacking faults from the initial layer of the first layer of the group III-nitride material. Regrowth of the group III-nitride material may be carried out after the removal of the stacking faults. In some embodiments, the semiconductor layer may be formed by performing one or more operations as described in connection with FIG. 11 below.

At block 1020, an epitaxial layer of the group III-nitride material may be formed on the growth template. The epitaxial layer may be formed on the process surface of the semiconductor layer (also referred to as the process surface of the growth template). Growing the epitaxial layer of the group III-nitride material may include growing the group III-nitride material in a suitable growth direction, such as a semipolar orientation or a nonpolar orientation. In some embodiments, the growth of the epitaxial layer may include growing the group III-nitride material using an HVPE process, an MBE process, an MOVCD process, and/or any other suitable epitaxial growth process.

At block 1030, the epitaxial layer of the group III-nitride material may be separated from the growth template to form a substrate of the group III-nitride material. Upon separation from the growth template, the epitaxial layer of the group III-nitride material may be used as a free-standing substrate for fabrication of semiconductor devices (e.g., LEDs, LDs, etc.). The epitaxial layer of the group III-nitride material may be separated from the growth template in any suitable manner. For example, the epitaxial layer of the group III-nitride material may be separated from the growth template along a longitudinal direction of the growth template. As another example, the epitaxial layer of the group III-nitride material may be separated from the growth template along an interface between the epitaxial layer and the growth template. The interface may be defined by a surface of the growth template and a surface of the epitaxial layer. The surface of the growth template may or may not contact the surface of the epitaxial layer. In one implementation, the epitaxial layer of the group III-nitride material may be separated from the growth template by slicing the growth template and/or the epitaxial layer (e.g., along the longitudinal direction of the growth template). In another implementation, the epitaxial layer of the group III-nitride material may be separated from the growth template by laser lift-off, chemical lift-off, etc.

Figure 11:
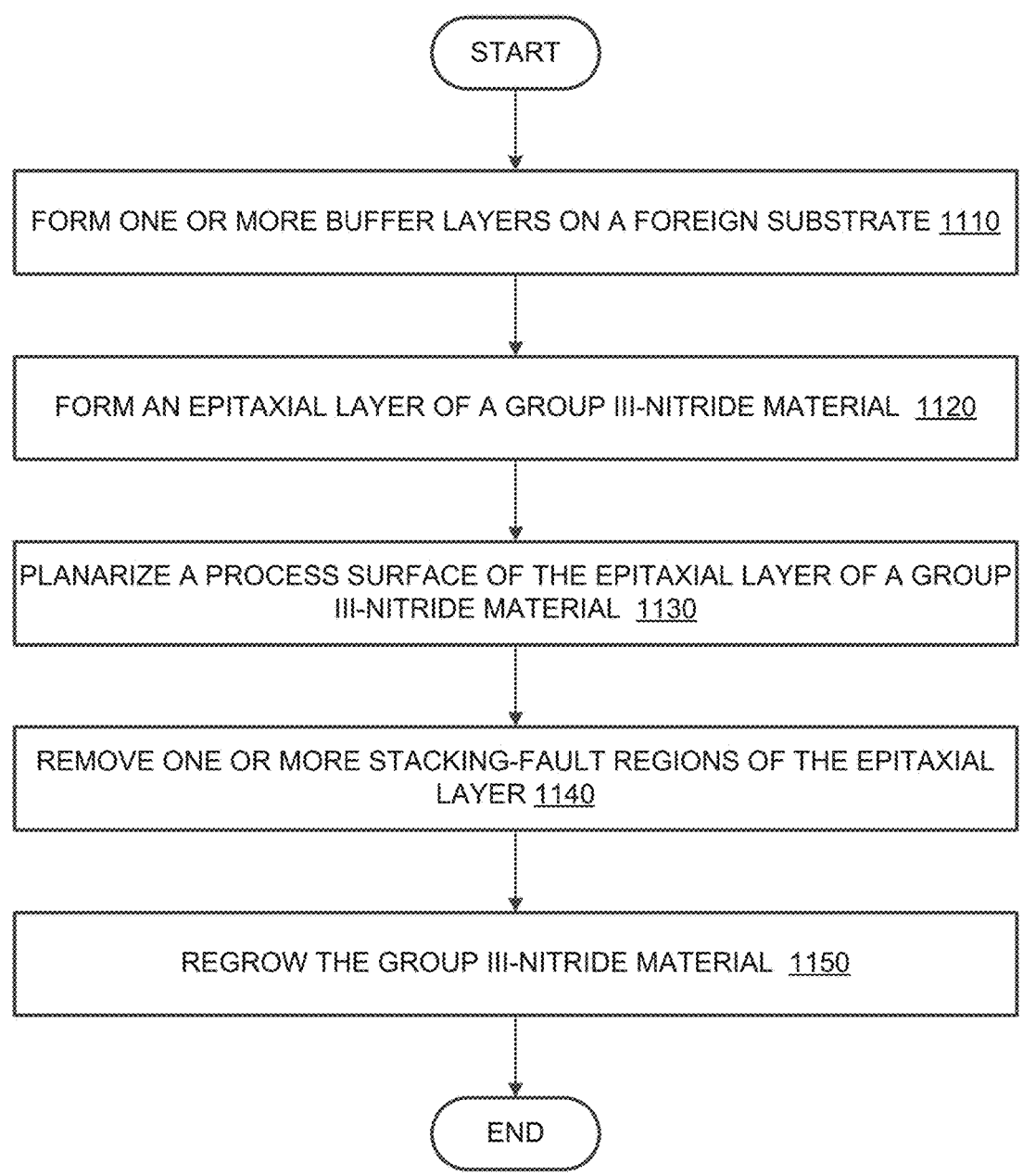
FIG. 11 is a flow diagram illustrating a method for producing a semiconductor layer of group III-nitride materials according to some embodiments of the present disclosure.

FIG. 11 is a flow diagram illustrating an example 1100 of a method for producing a semiconductor layer of group III-nitride materials according to some embodiments of the disclosure.

At block 1110, one or more buffer layers may be formed on a foreign substrate. The foreign substrate may be and/or include a patterned substrate provided at block 1012. The buffer layers may be formed from any suitable group III-nitride materials and/or any other suitable material, such as AlN, InN, AlGaN, InGaN, InAlGaN, etc. In some embodiments, the buffer layer(s) may be formed at the exposed crystal-growth surfaces of the foreign substrate. The buffer layer(s) may include one or more low-temperature buffer layers described in connection with FIG. 2G and may be formed under one or more growth conditions described in connection with FIG. 2G. For example, an AlN buffer layer and/or a GaN buffer layer may be formed on the foreign substrate.

At block 1120, an epitaxial layer of a group III-nitride material may be formed. One or more regions of the epitaxial layer may include stacking faults. The epitaxial layer may be formed using any suitable epitaxial growth process, such as an MOVCD process, a HVPE process, an MBE process, etc.

The group III-nitride material (e.g., GaN) may be grown from the crystal-growth surfaces of the substrate. During the growth of the group III-nitride material, III-nitride crystals (e.g., islands of III-nitride crystals 250 of FIG. 2H) may form across the surface of the patterned substrate. In some embodiments, the III-nitride crystals may grow with a crystallographic plane approximately parallel to the original planar surface of the foreign substrate. The crystallographic plane may be a semipolar plane or a nonpolar plane. In some embodiments, the growth of the group III-nitride material may be carried out so that the III-nitride crystals may coalesce. The III-nitride crystals may form a continuous epitaxial layer across one or more regions of the substrate and/or the entire substrate.

The group III-nitride material may be grown for a suitable period of time to achieve a desired thickness of the epitaxial layer. For example, the epitaxial layer of the group III-nitride material may be grown to a thickness so that a density of defects of the epitaxial layer is not greater than a predetermined threshold.

In some embodiments, at block 1130, the epitaxial layer may be planarized. For example, a process surface of the epitaxial layer (e.g., an upper surface of the epitaxial layer) may be planarized to remove ridges formed due to intersections of crystallographic planes (e.g., the (10$\bar{1}$0) and (10$\bar{1}$1) planes for semi-gallium-polar GaN). The planarization may remove one or more portions of the epitaxial layer. The epitaxial layer may be planarized, for example, by chemical-mechanical polishing the process surface of the epitaxial layer. In some embodiments, regrowth of the III-nitride material may be carried out on the planarized surface to form a regrowth layer.

At block 1140, one or more stacking-fault regions of the epitaxial layer may be removed. For example, the epitaxial layer may be selectively etched to remove one or more regions of the epitaxial layer that contain stacking faults and/or to reshape the group III-nitride crystals grown on the growth template. In some embodiments, various facets of the III-nitride crystals may or may not be etched at the same etch rate. For example, facets with various crystallographic orientations may be etched at various etch rates. More particularly, for example, one or more facets associated with the stacking-fault regions (also referred to as the "first facet(s)") may be etched at a first etch rate while one or more facets that are not associated with the stacking-fault regions (e.g., also referred to as the "second facet(s)") may be etched at a second etch rate. The first etch rate may be faster than the second etch rate. The first facet(s) associated with the stacking fault regions may be facet(s) with a first crystallographic orientation that is associated with the formation of the stacking faults (e.g., a (0001) direction). The second facet(s) that are not associated with the stacking-fault regions may be facet(s) with one or more other crystallographic orientations is different from the first crystallographic orientation (e.g., a second crystallographic orientation of (1010), a third crystallographic orientation of (1011), a fourth crystallographic orientation of (1011), etc.).

At block 1150, the group III-nitride material may be regrown. The regrowth of the group III-nitride material may fill one or more voids in the semiconductor layer formed by the removal of the stacking-faults regions. The regrowth of the group III-nitride material may include growing facets with various crystallographic orientations at various growth rates. For example, a first facet with the first crystallographic orientation may be grown at a first growth rate. A second facet with a second crystallographic orientation may be grown at a second growth rate. The first crystallographic orientation and/or the first facet may be associated with a first quantity and/or density of stacking faults (e.g., a quantity and/or density of stacking faults greater than a threshold). The second crystallographic orientation and/or the second facet may be associated with a second quantity and/or density of stacking faults (e.g., a quantity and/or density of stacking faults is not greater than a threshold). In some embodiments in which the first quantity and/or density of stacking faults is greater than the second quantity and/or density of stacking faults, the first growth rate may be faster than the second growth rate. In one implementation, the first growth rate may be greater than the second growth rate.

In some embodiments, the various growth rates may be controlled by accelerating the growth rate of one or more facets associated with the stacking faults. For example, the first growth rate of the first facet may be accelerated by adding one or more suitable dopants (e.g., Sb, Ge, Bi, etc.) during the regrowth of the group III-nitride material.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or memory page media.

The terms "approximately," "about," and "substantially" may be used to mean within ±20% of a target dimension in some embodiments, within ±10% of a target dimension in some embodiments, within ±5% of a target dimension in some embodiments, and yet within ±2% in some embodiments. The terms "approximately" and "about" may include the target dimension.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A method, comprising:
    forming, on a growth template, an epitaxial layer of a group III-nitride material comprising a surface with a first crystallographic orientation, wherein the first crystallographic orientation comprises a semipolar orientation or a nonpolar orientation; and separating the epitaxial layer of the group III-nitride material from the growth template to produce a group III-nitride substrate comprising the epitaxial layer of the group III-nitride material, wherein the growth template comprises a semiconductor layer of the group III-nitride material, and wherein the size of the epitaxial layer separated from the growth template is substantially the same as the size of the growth template.

2. The method of claim 1, wherein the epitaxial layer of the group III-nitride material is free of stacking faults.

3. The method of claim 1, wherein forming the epitaxial layer of the group III-nitride material comprises growing the group III-nitride material to a thickness greater than 100 microns.

4. The method of claim 1, wherein the group III-nitride material comprises gallium.

5. The method of claim 1, wherein the semiconductor layer is free of stacking faults.

6. The method of claim 1, wherein forming, on the growth template, the epitaxial layer of the group III-nitride material comprises growing the group III-nitride material utilizing at least one of a hydride vapor phase epitaxy (HVPE) process, a molecular beam epitaxy (MBE) process, or a metalorganic chemical vapor deposition (MOCVD) process.

7. The method of claim 1, wherein the epitaxial layer of the group III-nitride material is separated from the growth template along a longitudinal direction of the growth template.

8. The method of claim 1, wherein growing the epitaxial layer of the group III-nitride material comprises growing the group III-nitride material on a process surface of the growth template, and wherein separating the epitaxial layer of the group III-nitride material from the growth template comprises separating the surface of the epitaxial layer from the process surface of the growth template.

9. The method of claim 8, wherein the process surface of the growth template comprises a facet with the first crystallographic orientation.

10. The method of claim 8, further comprising growing the semiconductor layer of the group III-nitride material on a foreign substrate, wherein a substrate surface of the foreign substrate is approximately parallel to a crystallographic plane of the foreign substrate with a second crystallographic orientation, and wherein the substrate surface of the foreign substrate is approximately parallel to the process surface of the growth template.

11. The method of claim 10, wherein the foreign substrate comprises sapphire or silicon.

12. The method of claim 11, wherein the first crystallographic orientation comprises (20$\bar{2}$1), and wherein the second crystallographic orientation comprises (22$\bar{4}$3).

13. The method of claim 10, wherein growing the semiconductor layer further comprises removing stacking faults from at least one region of the semiconductor layer.

14. The method of claim 10, further comprising:
growing a first facet of the semiconductor layer at a first growth rate, wherein the first facet has a crystallographic orientation associated with stacking faults; and
growing a second facet of the semiconductor layer at a second growth rate, wherein the second growth rate is greater than the first growth rate.

15. The method of claim 14, further comprising doping the semiconductor layer with a dopant to control the first growth rate.

16. The method of claim 1, wherein the semiconductor layer comprises an epitaxial layer comprising the group III-nitride material of the first crystallographic orientation.

17. The method of claim 16, wherein the first crystallographic orientation comprises at least one of (20$\bar{2}$1), (20$\bar{2}$$\bar{1}$), (30$\bar{3}$1), (30$\bar{3}$$\bar{1}$), (10$\bar{1}$1), (11$\bar{2}$2), (11$\bar{2}$0), or (10$\bar{1}$0).

18. The method of claim 17, wherein separating the epitaxial layer of the group III-nitride material from the growth template to produce the group III-nitride substrate comprising the epitaxial layer of the group III-nitride material comprises separating the epitaxial layer of the group III-nitride material from the growth template along an interface between the epitaxial layer of the group III-nitride material and the growth template, wherein the interface is defined by a surface of the growth template and a surface of the epitaxial layer, and wherein the surface of the epitaxial layer is approximately parallel to a crystallographic plane with the first crystallographic orientation.

19. The method of claim 18, wherein the surface of the growth template is approximately parallel to the crystallographic plane with the first crystallographic orientation.

20. The method of claim 1, wherein a diameter of the epitaxial layer separated from the growth template is substantially the same as a diameter of the growth template.

* * * * *